(12) United States Patent
Chu et al.

(10) Patent No.: US 9,450,109 B2
(45) Date of Patent: Sep. 20, 2016

(54) MEMS DEVICES AND FABRICATION METHODS THEREOF

(71) Applicant: Taiwan Semiconductor Manufacturing Company, Ltd., Hsin-Chu (TW)

(72) Inventors: Chia-Hua Chu, Zhubei (TW); Chun-Wen Cheng, Zhubei (TW); Te-Hao Lee, Taipei (TW); Chung-Hsien Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 480 days.

(21) Appl. No.: 13/829,106

(22) Filed: Mar. 14, 2013

(65) Prior Publication Data

US 2014/0103461 A1   Apr. 17, 2014

Related U.S. Application Data

(63) Continuation-in-part of application No. 13/650,867, filed on Oct. 12, 2012.

(60) Provisional application No. 61/660,589, filed on Jun. 15, 2012.

(51) Int. Cl.
  H01L 29/84 (2006.01)
  H01L 21/02 (2006.01)
  H01L 21/50 (2006.01)
  H01L 21/30 (2006.01)
  (Continued)

(52) U.S. Cl.
  CPC ........... *H01L 29/84* (2013.01); *B81C 1/00238* (2013.01); *H01L 24/18* (2013.01); *B81C 2203/0792* (2013.01); *H01L 2924/01322* (2013.01); *H01L 2924/1461* (2013.01); *H01L 2924/15787* (2013.01)

(58) Field of Classification Search
  CPC ................... H01L 24/18; H01L 29/84; H01L 2924/1461; H01L 2924/00
  USPC ................................ 438/51, 50, 52; 257/415
  See application file for complete search history.

(56) References Cited

U.S. PATENT DOCUMENTS

| 8,350,346 B1 * | 1/2013 | Huang ................. B81B 3/0051 257/414 |
| 2007/0140514 A1 * | 6/2007 | Pedersen .............. H04R 19/005 381/150 |

(Continued)

FOREIGN PATENT DOCUMENTS

| TW | 201118036 | 6/2011 |
| TW | 201209897 | 3/2012 |
| TW | 201216342 | 4/2012 |

*Primary Examiner* — Michelle Mandala
*Assistant Examiner* — Thai T Vuong
(74) *Attorney, Agent, or Firm* — Slater Matsil, LLP

(57) ABSTRACT

A method for fabricating a MEMS device includes providing a micro-electro-mechanical system (MEMS) substrate having a sacrificial layer on a first side, providing a carrier including a plurality of cavities, bonding the first side of the MEMS substrate on the carrier, forming a first bonding material layer on a second side of the MEMS substrate, applying a sacrificial layer removal process to the MEMS substrate, providing a semiconductor substrate including a second bonding material layer and bonding the semiconductor substrate on the second side of the MEMS substrate.

20 Claims, 44 Drawing Sheets

(51) Int. Cl.
*H01L 21/20* (2006.01)
*H01L 23/00* (2006.01)
*B81C 1/00* (2006.01)

(56) References Cited

U.S. PATENT DOCUMENTS

| | | | |
|---|---|---|---|
| 2008/0053236 A1* | 3/2008 | Gogoi | B81C 1/00158 73/718 |
| 2008/0128901 A1* | 6/2008 | Zurcher | B81C 1/00238 257/724 |
| 2008/0224241 A1* | 9/2008 | Inaba | B81B 3/0075 257/415 |
| 2008/0272867 A1* | 11/2008 | Cohn | B81B 7/0077 335/78 |
| 2009/0154734 A1* | 6/2009 | Jeong | H04R 19/005 381/173 |
| 2009/0190782 A1* | 7/2009 | Suzuki | B81B 3/0008 381/174 |
| 2009/0309171 A1* | 12/2009 | Schrank | B81B 3/0072 257/415 |
| 2009/0309173 A1* | 12/2009 | Nakatani | B81B 3/007 257/415 |
| 2010/0072561 A1* | 3/2010 | Lee | B81C 1/00182 257/415 |
| 2010/0072860 A1* | 3/2010 | Kim | H04R 17/005 310/324 |
| 2010/0096714 A1* | 4/2010 | Nakatani | G01L 9/0042 257/419 |
| 2010/0276766 A1* | 11/2010 | Tang | B81B 7/0064 257/419 |
| 2010/0308424 A1* | 12/2010 | Wu | G01P 15/125 257/415 |
| 2010/0320548 A1 | 12/2010 | Tsau et al. | |
| 2011/0126632 A1 | 6/2011 | McNeil et al. | |
| 2012/0038372 A1 | 2/2012 | Reinmuth et al. | |
| 2012/0043627 A1* | 2/2012 | Lin | B81B 7/02 257/415 |
| 2012/0098074 A1* | 4/2012 | Lin | B81C 1/00333 257/414 |
| 2012/0119311 A1 | 5/2012 | Akhlaghi Esfahany et al. | |
| 2012/0248931 A1 | 10/2012 | Reinmuth | |

* cited by examiner

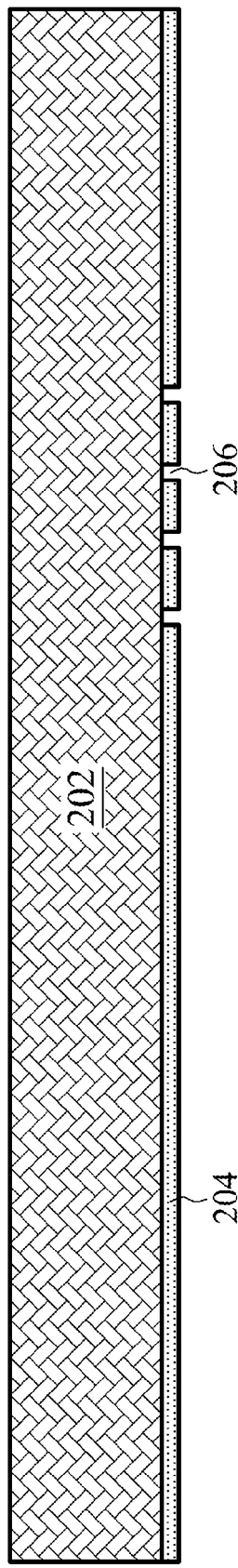
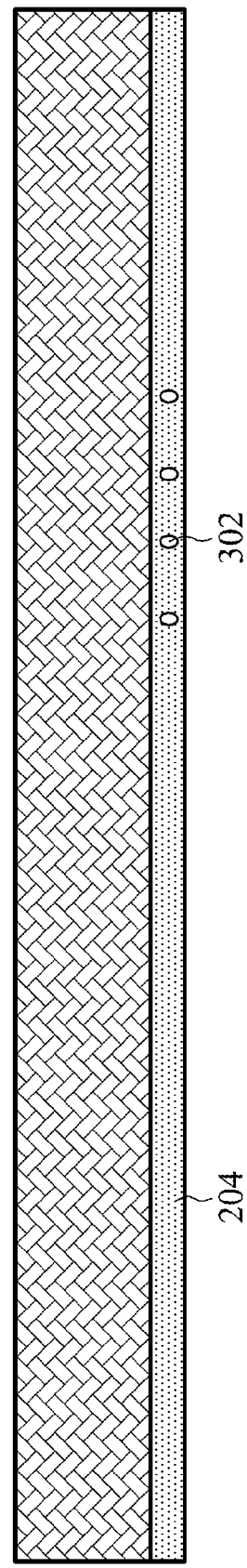
Figure 2
Figure 3

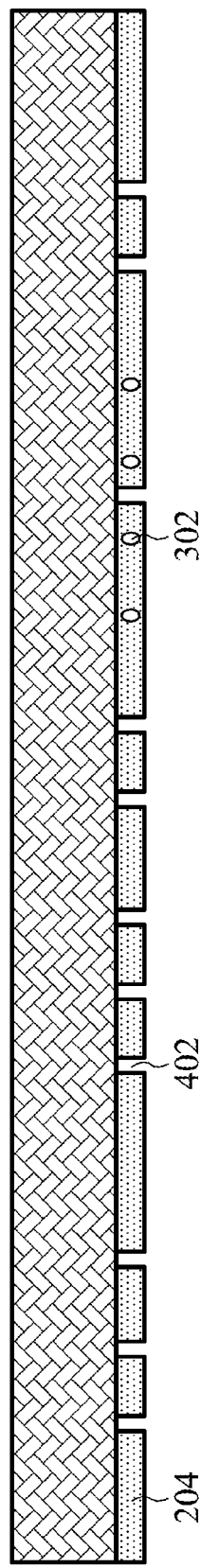
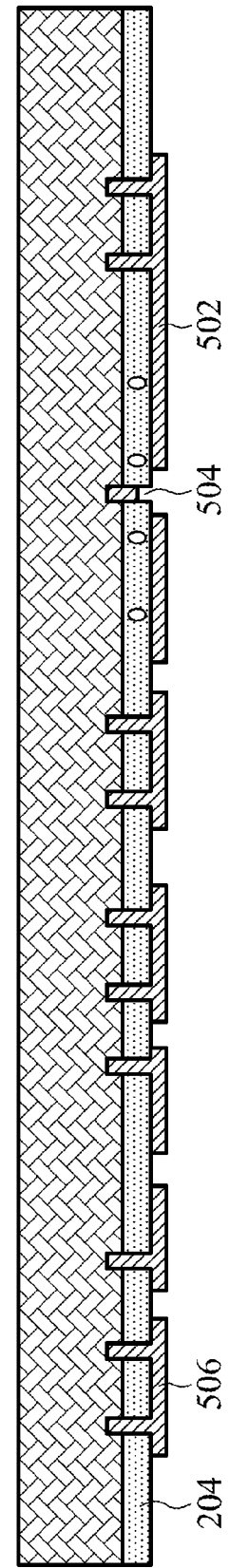

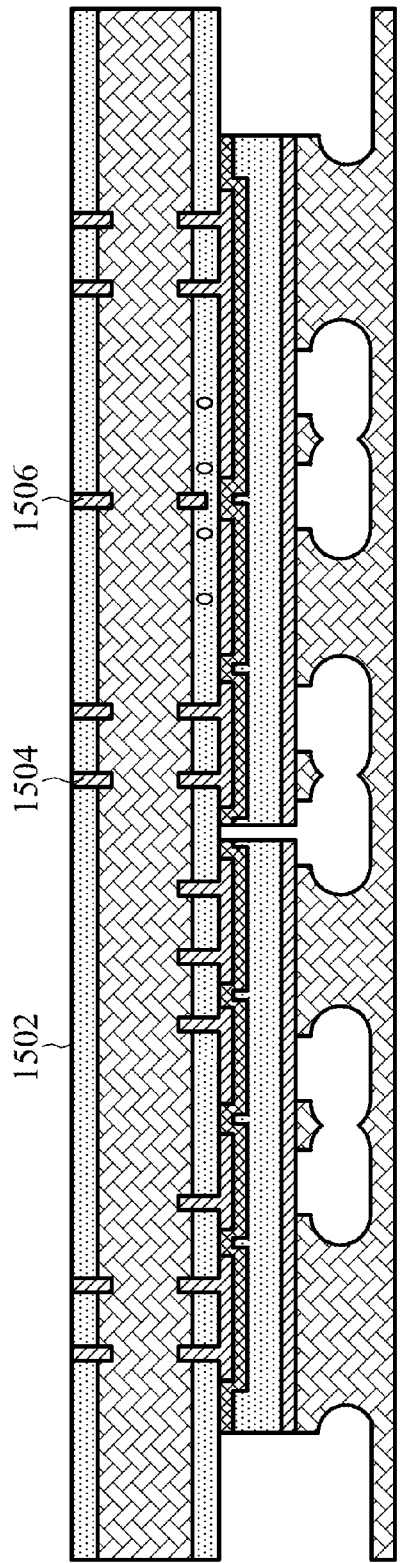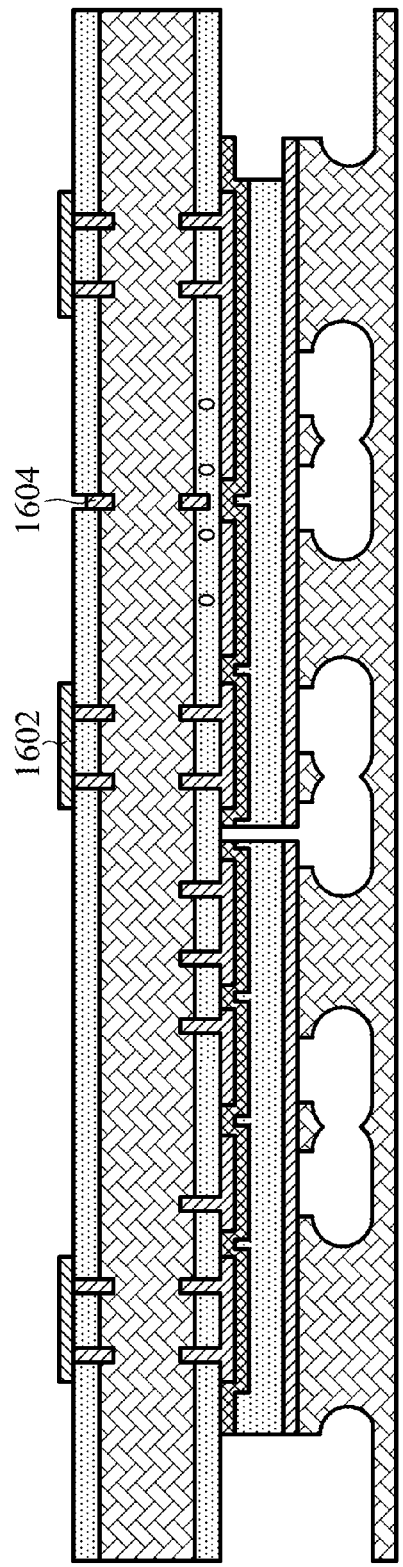
Figure 15
Figure 16

MEMS DEVICES AND FABRICATION METHODS THEREOF

This application is a continuation-in-part of U.S. patent application Ser. No. 13/650,867, filed Oct. 12, 2012, and entitled "MEMS Devices and Fabrication Methods Thereof," which application is hereby incorporated herein by reference.

BACKGROUND

Micro-electro-mechanical systems (MEMS) are the technology of forming micro-structures with mechanical and electronic features. The MEMS device may comprise a plurality of elements (e.g., movable elements) for achieving mechanical functionality. In addition, the MEMS device may comprise a variety of sensors that sense various mechanical signals such as pressure, inertial forces and the like, and convert the mechanical signals into their corresponding electrical signals.

For example, a MEMS device having an accelerometer may comprise a proof mass, which is attached to the structure of the MEMS device. In response to the influence of external accelerations, the proof mass may deflect from its neutral position and move relative to the structure of the MEMS device. A sensor is employed to detect the relative motion between the proof mass and the structure of the MEMS device. In addition, the sensor may generate an electrical signal proportional to the motion strength of the proof mass.

In order to reduce the cost of manufacturing and packaging of MEMS systems, MEMS systems may comprise both micromechanical devices and electronic circuits. More particularly, the micromechanical devices and the electronic circuits such as complementary metal oxide semiconductor (CMOS) devices may be fabricated in the same manufacturing process and both devices may be bonded together through suitable bonding techniques such as eutectic bonding and the like.

MEMS applications include motion sensors, pressure sensors, printer nozzles and the like. Other MEMS applications include inertial sensors such as accelerometers for measuring linear acceleration and gyroscopes for measuring angular velocity. Moreover, MEMS applications may extend to optical applications such as movable mirrors, and radio frequency (RF) applications such as RF switches and the like.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 2 illustrates a cross-sectional view of a semiconductor device having a plurality of openings in a dielectric layer formed over a substrate in accordance with an embodiment;

FIG. 3 is a cross sectional view of the semiconductor device illustrated in FIG. 2 after an oxide deposition process has been applied to the dielectric layer side of the wafer in accordance with an embodiment;

FIG. 4 illustrates a cross sectional view of the semiconductor device shown in FIG. 3 after a plurality of opening are formed in the dielectric layer in accordance with an embodiment;

FIG. 5 illustrates a cross sectional view of the semiconductor device shown in FIG. 4 after a polysilicon layer is formed on the dielectric layer in accordance with an embodiment;

FIG. 15 illustrates a cross sectional view of the semiconductor device shown in FIG. 14 after a thinning process, an oxide deposition process and a polysilicon deposition process are performed to the MEMS device in accordance with an embodiment;

FIG. 16 illustrates the formation and patterning of a bonding material layer on top of the MEMS device in accordance with an embodiment;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a micro-electro-mechanical system (MEMS) device. The embodiments of the disclosure may also be applied, however, to a variety of electrical or mechanical semiconductor devices. Hereinafter, various embodiments will be explained in detail with reference to the accompanying drawings.

Figure 1A:
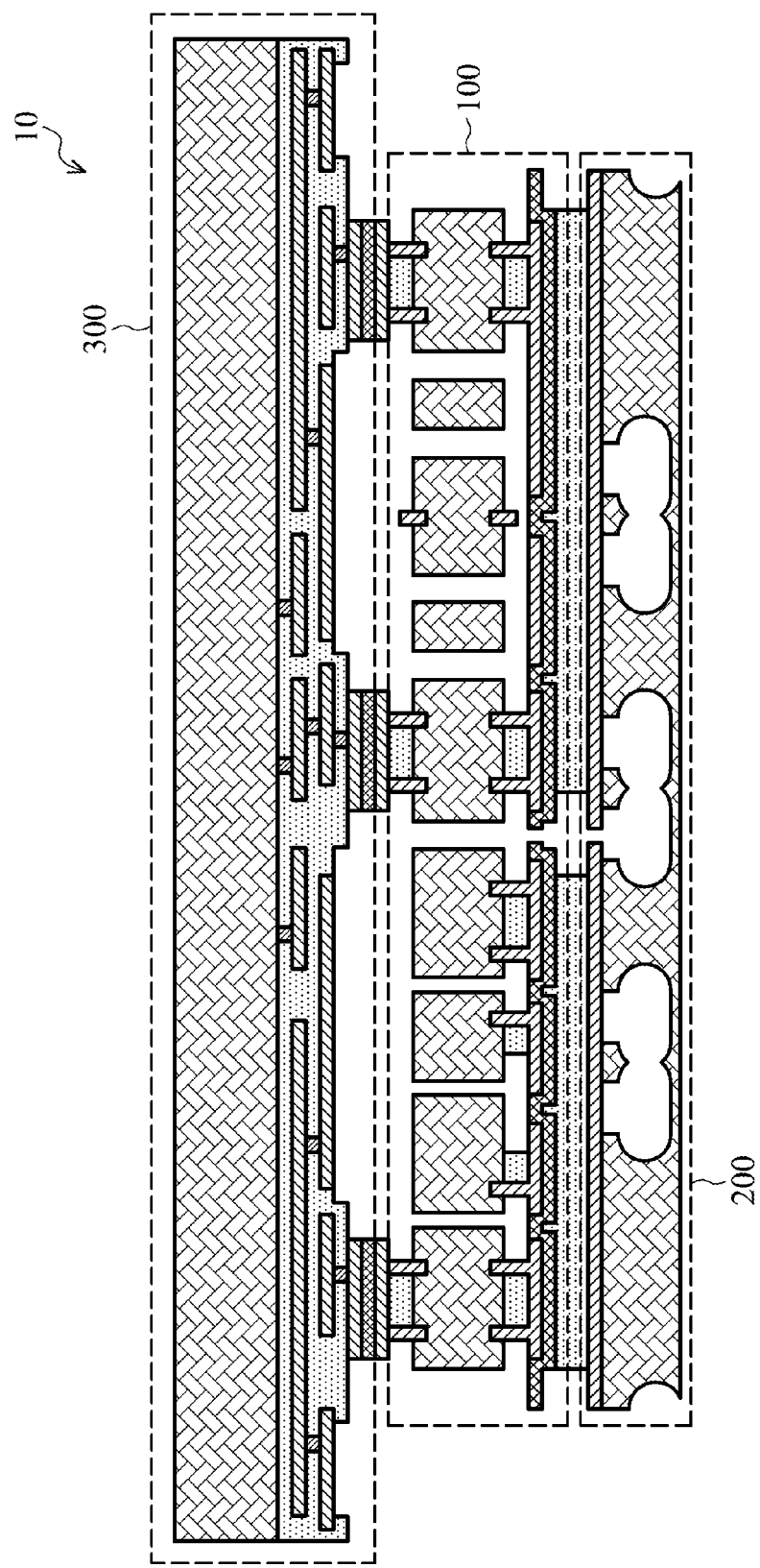
FIG. 1A illustrates a cross-sectional view of a MEMS in accordance with an embodiment.

FIG. 1A illustrates a cross-sectional view of a MEMS in accordance with an embodiment. The MEMS 10 includes a MEMS device 100, a carrier 200 and a CMOS device 300. As shown in FIG. 1, the MEMS device 100 is sandwiched between the carrier 200 and the CMOS device 300. Suitable bonding techniques such as fusion bonding, eutectic bonding and the like may be employed to bond the MEMS device 100, the carrier 200 and the CMOS device 300 together.

The CMOS device 300 may include a substrate. In accordance with an embodiment, the substrate of the CMOS device 300 may be formed of silicon. Alternatively, the substrate of the CMOS device 300 may be formed of other semiconductor materials including silicon germanium (SiGe), silicon carbide and the like. Furthermore, other substrates that may be used include multi-layered substrates, gradient substrates, hybrid orientation substrates and any combinations thereof.

The CMOS device 300 may include active and passive devices (not shown). As one of ordinary skill in the art will recognize, a wide variety of active and passive devices such as transistors, capacitors, resistors, combinations of these, and the like may be used to generate the structural and functional requirements of the design for the MEMS 10. The active and passive devices may be formed using any suitable methods.

The MEMS device 100 may comprise a substrate having MEMS features and functionality. The substrate of the MEMS device 100 may have similar materials as the substrate of the CMOS device 300, although the substrate of the CMOS device 300 and the MEMS device 100 are not necessary to be the same material. The CMOS device 300 is bonded on top of the MEMS device 100. According to an embodiment, the bonding process may be implemented by using eutectic bonding. In other embodiments, the bonding process may include other suitable bonding techniques such as fusion boding, thermo-compression bonding, direct bonding, glue bonding or the like.

The carrier 200 includes a substrate having a plurality of cavities. In accordance with an embodiment, the substrate of the carrier 200 may be formed of silicon. Alternatively, the carrier 200 may be formed of suitable materials including a ceramic substrate, a quartz substrate and the like.

The carrier 200 may include active and passive devices. As one of ordinary skill in the art will recognize, a wide variety of active and passive devices such as transistors, capacitors, resistors, combinations of these, and the like may be used to generate the structural and functional requirements of the design for the MEMS 10. The active and passive devices may be formed using any suitable methods.

As shown in FIG. 1A, the MEMS device 100 as well as the CMOS device 300 are boned together and further bonded on top of the carrier 200. In accordance with an embodiment, the MEMS device 100 and the carrier 200 may be bonded together through suitable bonding techniques such as fusion bonding.

Figure 1B:
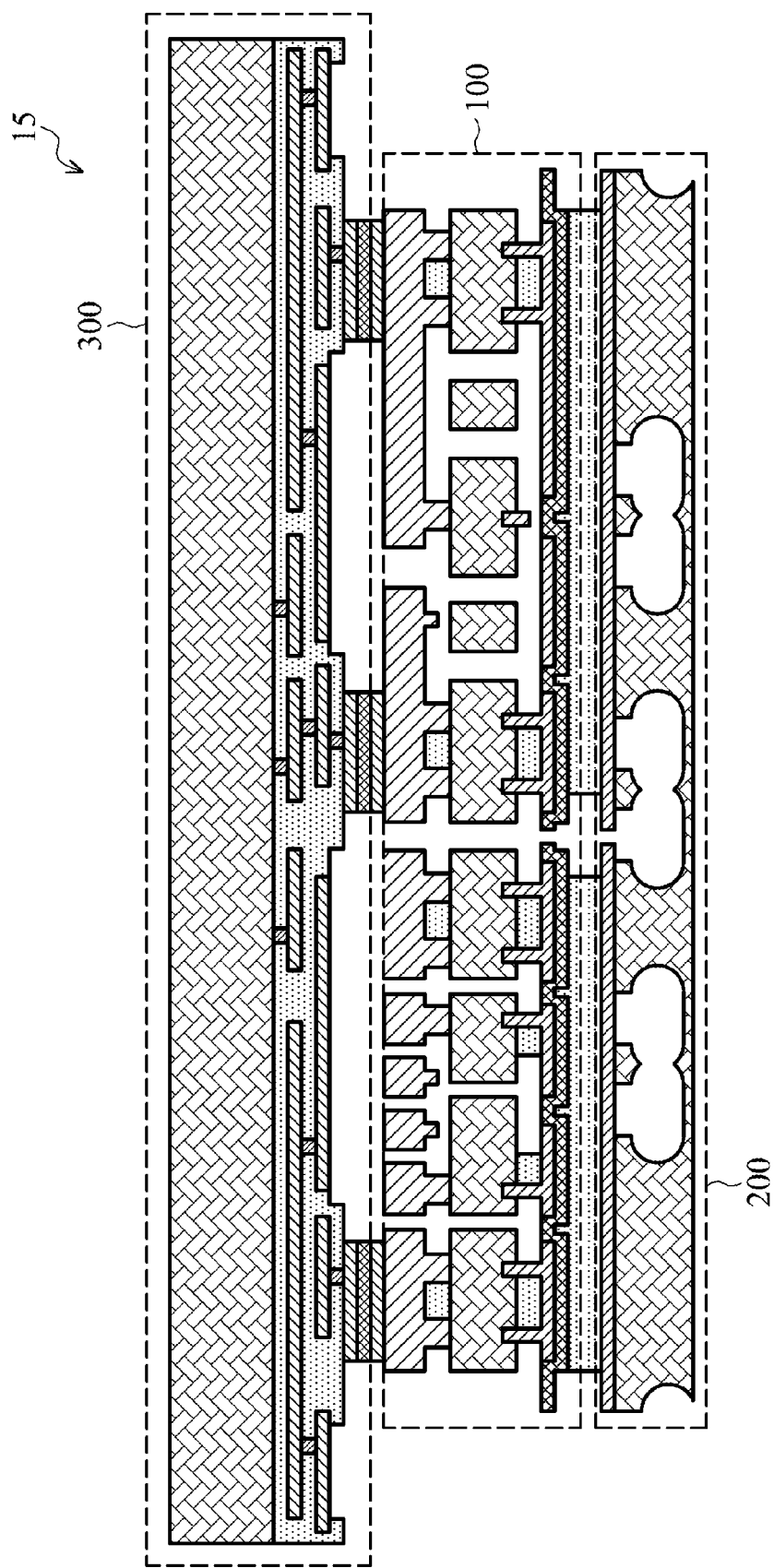
FIG. 1B illustrates a cross-sectional view of another MEMS in accordance with an embodiment.

FIG. 1B illustrates a cross sectional view of another MEMS in accordance with an embodiment. The structure of the MEMS 15 is similar to that of the MEMS 10 shown in FIG. 1A except that one additional thin structure layer is formed between the MEMS device 100 and the CMOS device 300. One advantageous feature of having the thin structure layer is that soft out-of-plane structures such as springs may be formed by the thin structure layer. Such a thin structure layer helps to improve the dimension of the MEMS 15 while keeping easy movements along the Z axis of the MEMS 15.

Figure 1C:
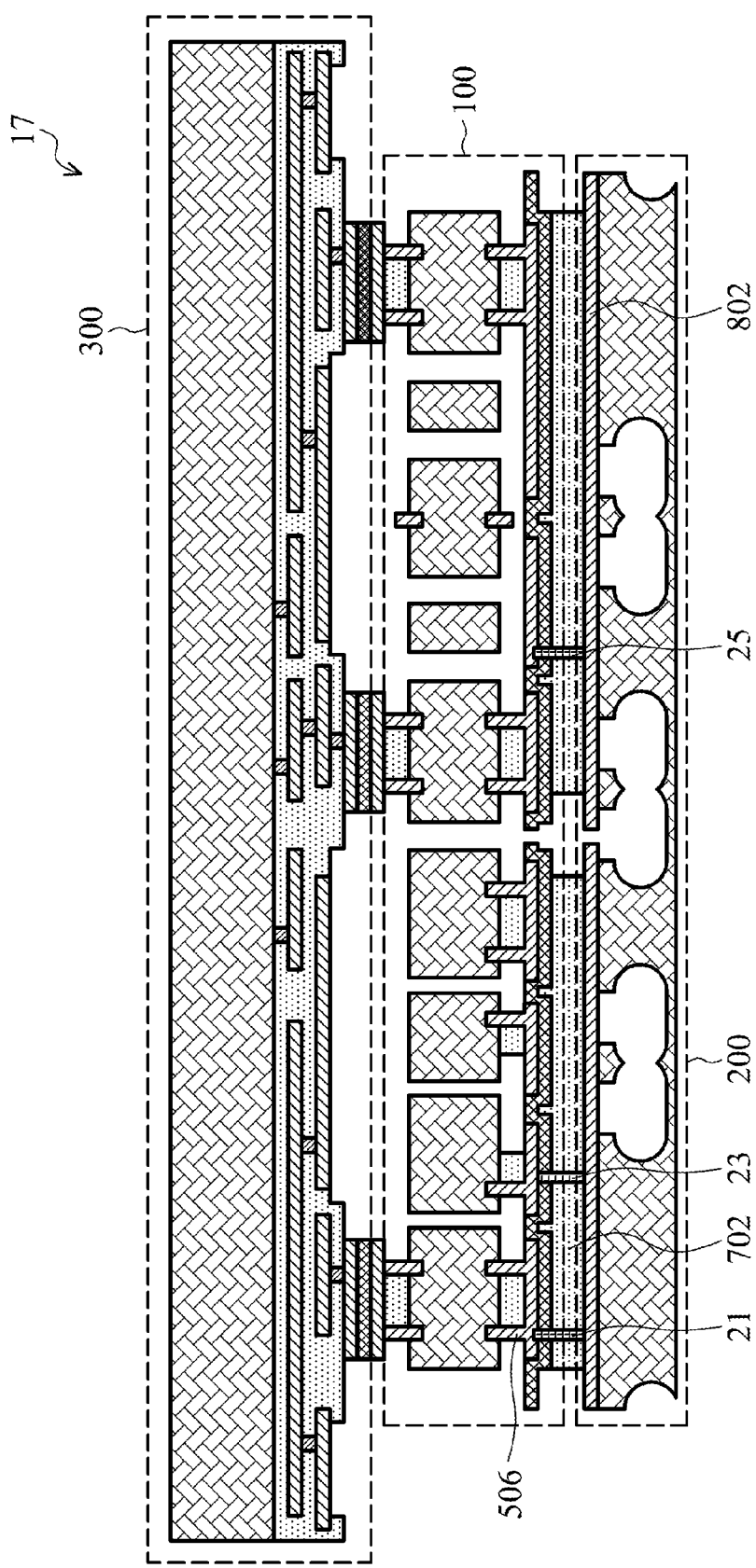
FIG. 1C illustrates a cross-sectional view of another MEMS in accordance with an embodiment.

FIG. 1C illustrates a cross sectional view of another MEMS in accordance with an embodiment. The structure of the MEMS 17 is similar to that of the MEMS 10 shown in FIG. 1A except that a plurality of vias 21, 23 and 25 are formed between a poly-silicon structure 506 and a bonding interface layer 802 of the MEMS device 100. More particularly, the vias 21, 23 and 25 are formed in an oxide layer 702. It should be noted that the poly-silicon structure 506 may function as a bottom electrode of the MEMS device 100.

One advantageous feature of having the vias 21, 23 and 25 in the oxide layer 702 is that the vias 21, 23 and 25 can prevent noise from affecting the MEMS device 100. In particular, the bonding interface layer 802 may be formed of poly-silicon and connected to a ground plane as a shielding plane through the vias 21, 23, 25 in the oxide layer 702. By adopting the bonding interface layer 802 as a ground shielding plane, some noise issues such as parasitic capacitive coupling can be avoided.

Figure 1D:
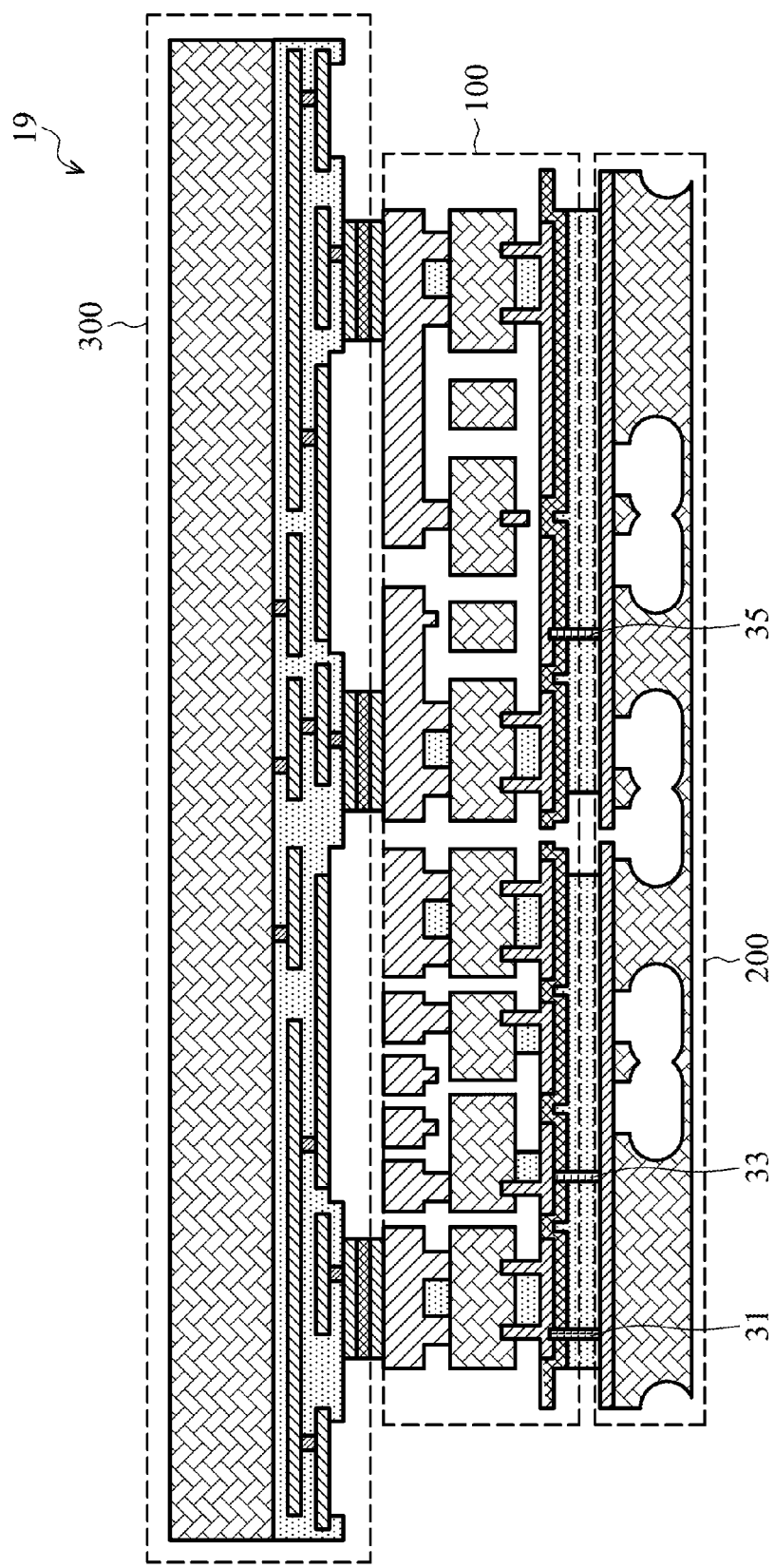
FIG. 1D illustrates a cross-sectional view of another MEMS in accordance with an embodiment.

FIG. 1D illustrates a cross sectional view of another MEMS in accordance with an embodiment. The structure of the MEMS 19 is similar to that of the MEMS 15 shown in FIG. 1B except that a plurality of vias 31, 33 and 35 are formed in the MEMS device 100. The function of the vias 31, 33 and 35 is similar to that of the vias 21, 23 and 25 shown in FIG. 1C, and hence is not discussed again herein.

FIGS. 2-8 illustrate intermediate steps of fabricating a MEMS device in accordance with an embodiment. FIG. 2 illustrates a cross-sectional view of a semiconductor device having a plurality of openings in a dielectric layer formed over a substrate in accordance with an embodiment. The substrate 202 may be formed of silicon, silicon germanium, silicon carbide or the like. The substrate 202 may be formed of low resistive silicon. Alternatively, the substrate 202 may be a silicon-on-insulator (SOI) substrate. The SOI substrate may comprise a layer of a semiconductor material (e.g., silicon, germanium and the like) formed over an insulator layer (e.g., buried oxide and the like), which is formed in a silicon substrate. In addition, other substrates that may be used include multi-layered substrates, gradient substrates, hybrid orientation substrates and the like.

A dielectric layer 204 is formed on top of the substrate 202. The dielectric layer 204 may be formed, for example, of a low-K dielectric material, such as silicon oxide. The dielectric layer 204 may be formed by any suitable deposition techniques known in the art, such as spinning, chemical vapor deposition (CVD) and plasma enhanced chemical vapor deposition (PECVD) and the like.

FIG. 2 further illustrates the patterning of the dielectric layer 204 to form openings 206 in the dielectric layer 204. The patterning process may be accomplished by depositing a commonly used mask material (not shown) such as photoresist over the dielectric layer 202. The mask material is then patterned and the dielectric layer 202 is etched in accordance with the pattern to form the openings 206.

FIG. 3 is a cross sectional view of the semiconductor device illustrated in FIG. 2 after an oxide deposition process has been applied to the dielectric layer side of the substrate in accordance with an embodiment. As shown in FIG. 3, the oxide may be employed to seal off the upper terminals of the openings 206. The oxide deposition may be formed using a deposition process such as CVD or the like. More particularly, by controlling the deposition process, the material of the oxide layer may be deposited in a non-conformable manner. In other words, the materials of the oxide layer may build up on the upper terminal of the opening faster than along the sidewalls and the bottom of the opening. This process leads to the formation of an overhang at the edge of the upper terminal of the opening and, as the deposition process continues, the overhangs will merge, thereby sealing off the upper terminal of the opening to form a plurality of seams 302.

As shown in FIG. 3, the seams 302 are embedded in the oxide layer 204. In accordance with an embodiment, the oxide layer 204 is a sacrificial oxide layer of a MEMS device. During a releasing process of the MEMS device, the seams 302 help to reduce the releasing time of the MEMS device.

FIG. 4 illustrates a cross sectional view of the semiconductor device shown in FIG. 3 after a plurality of opening are formed in the dielectric layer in accordance with an embodiment. A patterning process may be applied to the dielectric layer 204 to form a plurality of openings 402. The patterning process may be accomplished by depositing a commonly used mask material (not shown) such as photoresist over the dielectric layer 204. The mask material is then patterned and the dielectric layer 204 is etched in accordance with the pattern.

According to the fabrication processes of the MEMS device 100, the oxide side of the substrate is thinned until a desired thickness is achieved. In accordance with an embodiment, the thickness of the oxide layer 204 is in a range from about 0.5 um to about 5 um. The thinning process may be implemented by using suitable techniques such as grinding, polishing and/or chemical etching. In accordance with an embodiment, the thinning process may be implemented by using a chemical mechanical polishing (CMP) process. In a CMP process, a combination of etching materials and abrading materials are put into contact with the oxide side of the substrate and a grinding pad (not shown) is used to grind away a portion of the oxide layer 204 of the substrate until the desired thickness is achieved.

FIG. 5 illustrates a cross sectional view of the semiconductor device shown in FIG. 4 after a polysilicon layer is formed on the dielectric layer in accordance with an embodiment. The polysilicon layer 502 is formed on the dielectric layer 204 through suitable fabrication techniques such as CVD. The polysilicon layer 502 may be of a thickness in a range from about 0.1 um to about 2 um.

The polysilicon layer 502 may be patterned to form functional elements such as electrodes and routing structures (e.g., polysilicon structure 506). In addition, an over-etch process may be employed to form mechanical bumps (e.g., bump 504). It should be noted the polysilicon structure 506 may function as bottom electrodes of the MEMS device. As shown in FIG. 5, the electrodes are further coupled to the substrate through a plurality of polysilicon vias. One advantageous feature of having the polysilicon layer 502 shown in FIG. 5 is that the electrical connection between the bottom electrodes and the substrate can be formed without a deep silicon etching process.

It should be noted that while a single polysilicon layer 502 is illustrated, those skilled in the art will recognize that multiple polysilicon layers could be employed. Alternatively, an appropriate conducting material could likewise be employed for form the electrodes and routing structures shown in FIG. 5.

Figure 6:
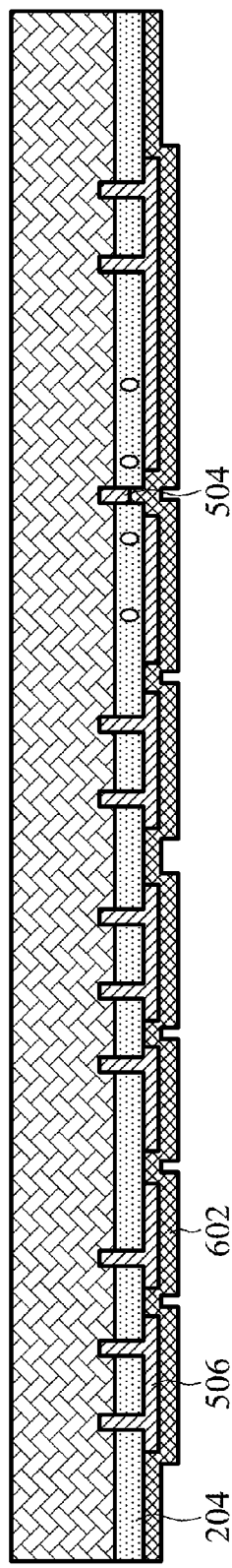
FIG. 6 illustrates a cross sectional view of the semiconductor device shown in FIG. 5 after a low stress nitride layer is formed on the dielectric layer as well as the polysilicon layer in accordance with an embodiment.

FIG. 6 illustrates a cross sectional view of the semiconductor device shown in FIG. 5 after a vapor hydrogen fluoride (HF) stop layer is formed on the dielectric layer as well as the polysilicon layer in accordance with an embodiment. Before the vapor HF stop layer is deposited on the semiconductor device, another oxide deposition process may be applied to the semiconductor device. In particular, an oxide layer is deposited so that the electrodes 506 as well as the mechanical bumps 504 are covered by the oxide layer. An etch-back process is applied subsequently. As a result, the surface of the electrode 506 is exposed and the mechanical bump 504 is still covered by the oxide layer.

After the etching-back process has been applied to the semiconductor device shown in FIG. 6, the vapor HF stop layer may be formed on the polysilicon side of the semiconductor device. In accordance with an embodiment, the vapor HF stop layer may be a low stress nitride layer. Alternatively, the vapor HF stop layer may be formed of other suitable materials such as SiC, AlN, $Al_2O_3$ and the like. Throughout the description, the vapor HF stop layer may be alternatively referred to as a low stress nitride layer. The low stress nitride layer 602 may be deposited on dielectric layer 204 through suitable fabrication techniques such as CVD, Low-Pressure CVD (LPCVD) and the like.

Figure 7:
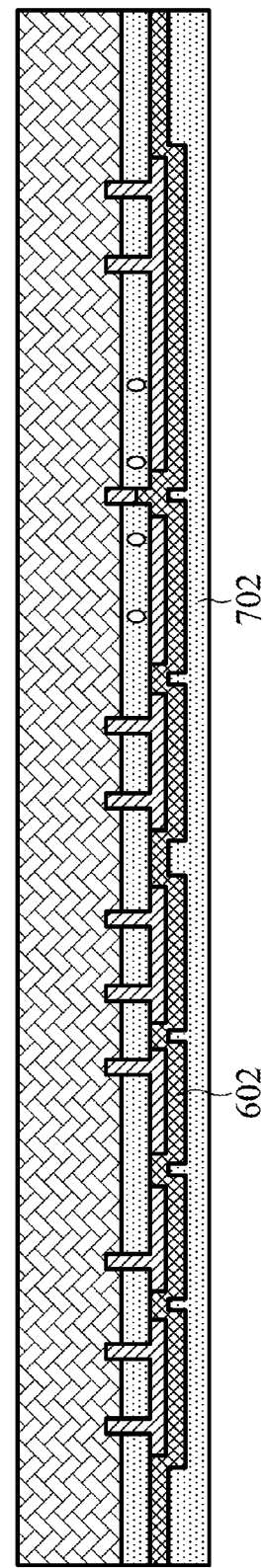
FIG. 7 illustrates a cross sectional view of the semiconductor device shown in FIG. 6 after an oxide deposition process is applied to the low stress nitride layer in accordance with an embodiment.

FIG. 7 illustrates a cross sectional view of the semiconductor device shown in FIG. 6 after an oxide deposition process is applied to the low stress nitride layer in accordance with an embodiment. An oxide layer 702 is further formed on the low stress nitride layer 602, as illustrated in FIG. 7. The oxide layer 702 may be formed by using well known deposition techniques such as CVD, or using some other conventional techniques. The oxide layer 702 has a flat surface. If a sufficiently flat surface is not obtained by the oxide deposition or formation process, flatness can be achieved by employing a CMP process or an etch-back process, as are known in the art.

Figure 8:
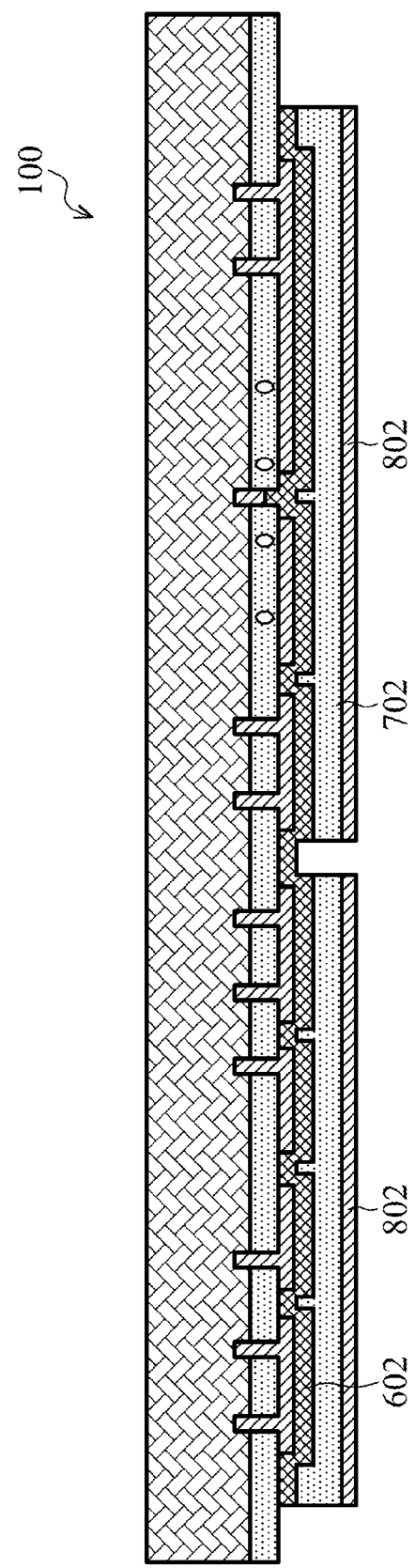
FIG. 8 illustrates a cross sectional view of the semiconductor device shown in FIG. 7 after a polysilicon layer is formed on the oxide layer in accordance with an embodiment.

FIG. 8 illustrates a cross sectional view of the semiconductor device shown in FIG. 7 after a polysilicon layer is formed on the oxide layer in accordance with an embodiment. A bonding interface layer 802 is deposited over the oxide layer 702. In accordance with an embodiment, the bonding interface layer may be formed of polysilicon. Alternatively, the bonding interface layer 802 may be formed of any suitable bonding materials such as silicon, amorphous silicon, silicon doped with impurities, any combinations thereof and the like. The polysilicon layer 802 is formed on oxide layer 702 through suitable fabrication techniques such as CVD, PVD and the like. The polysilicon layer 802, the oxide layer 702 and the low stress nitride layer 602 may be patterned to form the channels connected to air cavities (not shown) of a MEMS device.

Figure 9:
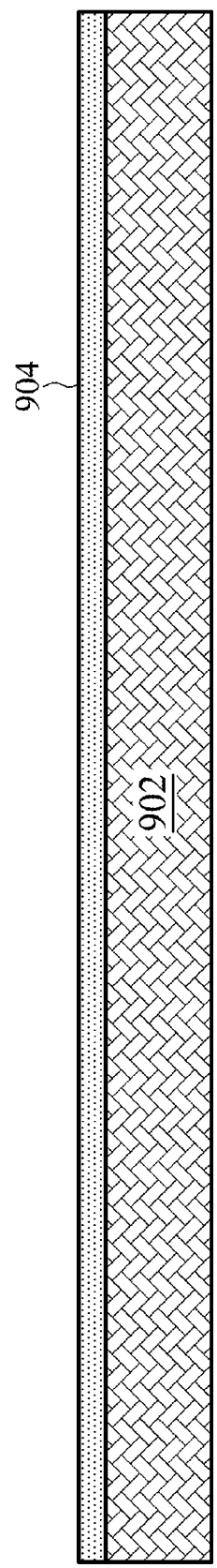
FIG. 9 illustrates a cross sectional view of a carrier in accordance with an embodiment.

FIGS. 9-13 illustrate intermediate steps of fabricating a carrier in accordance with an embodiment. FIG. 9 illustrates a cross sectional view of a carrier in accordance with an embodiment. The carrier may comprise a silicon substrate 902. As shown in FIG. 9, a dielectric layer 904 may be formed on the top surface of the substrate 902. In accordance with an embodiment, the dielectric layer 904 may be a thermal oxide layer formed by performing a thermal oxidation on the carrier.

Figure 10:
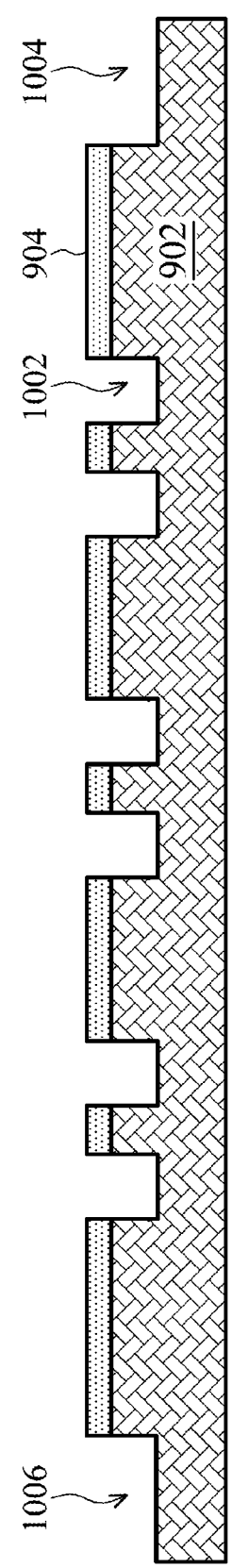
FIG. 10 illustrates a cross sectional view of the semiconductor device shown in FIG. 9 after an etching process is applied to the carrier and deep openings are formed in the substrate of the carrier in accordance with an embodiment.

FIG. 10 illustrates a cross sectional view of the semiconductor device shown in FIG. 9 after an etching process is applied to the carrier and deep openings are formed in the substrate of the carrier in accordance with an embodiment. As shown in FIG. 10, a Deep Reactive-Ion Etching (DRIE) process is performed to form deep openings 1002 in the substrate 902. It should be noted that due to etching loading effects, the wide openings at the edges of the cell (e.g., openings 1004 and 1006) are deeper than the narrow openings in the center and middle of the cell (e.g., opening 1002).

Figure 11:
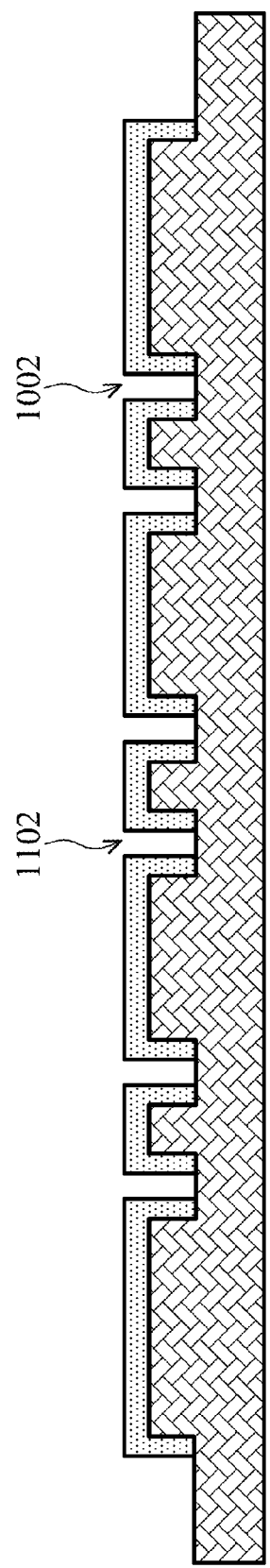
FIG. 11 illustrates a cross sectional view of the semiconductor device shown in FIG. 10 after an oxide layer is deposited in the openings and on the surface of the semiconductor device in accordance with an embodiment.

FIG. 11 illustrates a cross sectional view of the semiconductor device shown in FIG. 10 after an oxide layer is deposited in the openings and on the surface of the semiconductor device in accordance with an embodiment. The oxide layer 1102 may be formed by any suitable oxidation processes such as wet or dry thermal oxidation process, CVD or the like. An etching process, such as a reactive ion etch (RIE) or other dry etch, an anisotropic wet etch, or any other suitable anisotropic etch or patterning process, is performed to remove the bottom portion of the oxide layer 1102. As a result, the bottom portions of the openings 1002 are free from oxide. As shown in FIG. 11, the sidewalls of the openings are protected by the oxide layer 1102. It should be noted that the protection layer formed on the sidewalls can be replaced by other materials such as photoresist, polymer and the like.

Figure 12:
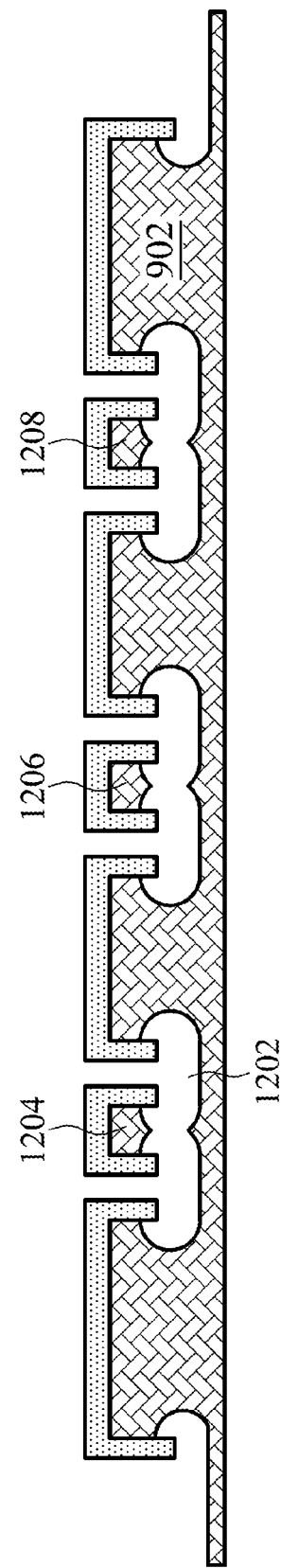
FIG. 12 illustrates a cross sectional view of the semiconductor device shown in FIG. 11 after an etching process is applied to the carrier in accordance with an embodiment.

FIG. 12 illustrates a cross sectional view of the semiconductor device shown in FIG. 11 after an etching process is applied to the carrier in accordance with an embodiment. Portions of the substrate 902 may be removed to form cavities 1202 by an etching process. The etching process may be any suitable etching processes such as isotropic silicon etching processes. The protection layers on the sidewalls of the opening 1002 (shown in FIG. 11) prevent the etching process from damaging the silicon membranes 1204, 1206 and 1208. The remained silicon membranes 1204, 1206 and 1208 help to improve the bonding ratio of a fusion bonding process, which will be described below with respect to FIG. 14.

Figure 13:
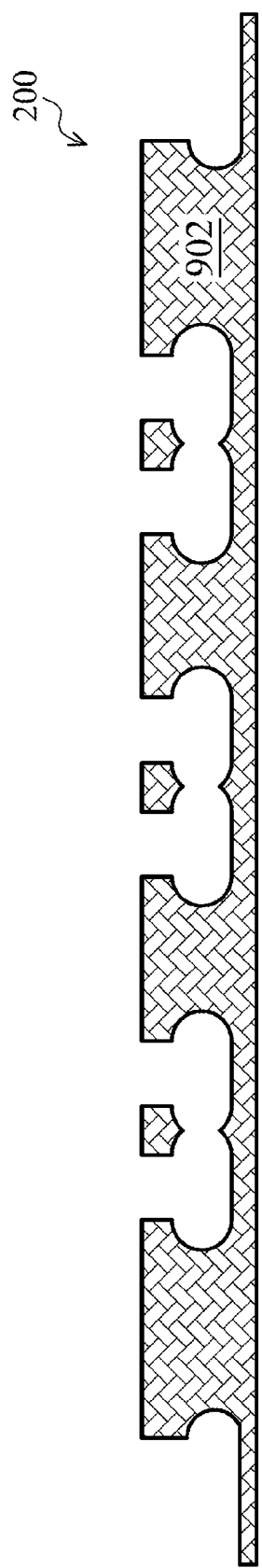
FIG. 13 illustrates a cross sectional view of the semiconductor device shown in FIG. 12 after an oxide removal process is applied to the carrier.

FIG. 13 illustrates a cross sectional view of the semiconductor device shown in FIG. 12 after an oxide removal process is applied to the carrier in accordance with an embodiment. As shown in FIG. 13, the oxide layer shown in FIG. 12 has been removed through a suitable removal process such as a wet etch process. The removal process is applied to the top surface of the carrier until the substrate is exposed. It should be noted the oxide removal is an optional step. A fusion bonding process is capable of bonding a carrier with an oxide bonding interface layer with a MEMS device.

Figure 14:
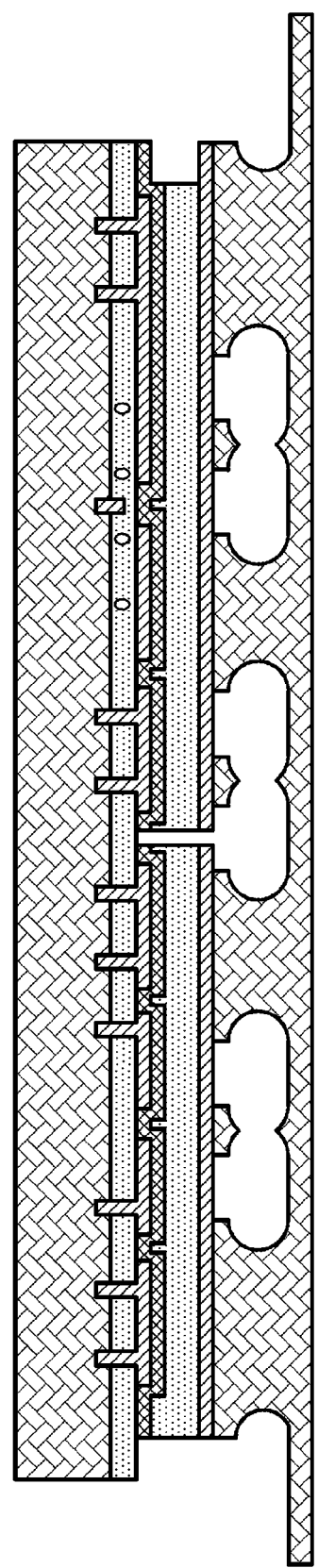
FIG. 14 illustrates a cross sectional view of a semiconductor device having a MEMS device stacked on top of a carrier.

FIGS. 14-18 illustrate intermediate steps of bonding the MEMS device on top of the carrier in accordance with an embodiment. FIG. 14 illustrates a cross sectional view of a semiconductor device having a MEMS device stacked on top of a carrier. The MEMS device and the carrier may be bonded together through suitable bonding techniques such as fusion bonding, anodic bonding, eutectic bonding and the like. In accordance with an embodiment, the MEMS device and the carrier may be bonded together by a fusion bonding process between the bonding interface layer 802 (on MEMS device) and the top surface of the carrier.

FIG. 15 illustrates a cross sectional view of the semiconductor device shown in FIG. 14 after a thinning process is applied to the top surface of the MEMS device in accordance with an embodiment. A grinding process may be performed on the top side of the MEMS device as shown in FIG. 15. The grinding process is performed until a desired thickness is achieved. In accordance with an embodiment, the MEMS device is of a thickness in a range from about 5 um to about 60 um.

An oxide layer 1502 is deposited on top of the MEMS device through suitable fabrication techniques such as CVD or the like. The oxide layer 1502 is then patterned according to the location of connection plugs 1504 and mechanical bumps 1506. An etching step is then performed to etch through the oxide layer 1502 to form a plurality of openings for the connection plugs 1504 and mechanical bumps 1506. A conductive layer (not shown) formed of polysilicon is deposited on top of the oxide layer 1502. The conductive material is filled into the openings to form contact plugs 1504 and mechanical bumps 1506. As shown in FIG. 15, the contact plugs 1504 are electrically coupled to the substrate. A CMP process may be employed to remove the conductive layer on top of the MEMS device. The CMP process is performed until the oxide layer 1502 is exposed.

FIG. 16 illustrates the formation and patterning of a bonding material layer on top of the MEMS device in accordance with an embodiment. The bonding material layer is formed over the oxide layer 1502. The bonding material 1602 may be made of aluminum copper, germanium, gold, the like, or a combination thereof. The bonding material 1602 may be formed using PVD, such as sputtering or evaporation, the like, a combination thereof, or other acceptable methods. The bonding material layer 1602 may be patterned using acceptable lithography techniques. In addition, an over-etching process may be employed to remove a portion of the poly 1506 to form the mechanical bump 1604 as shown in FIG. 16.

Figure 17:
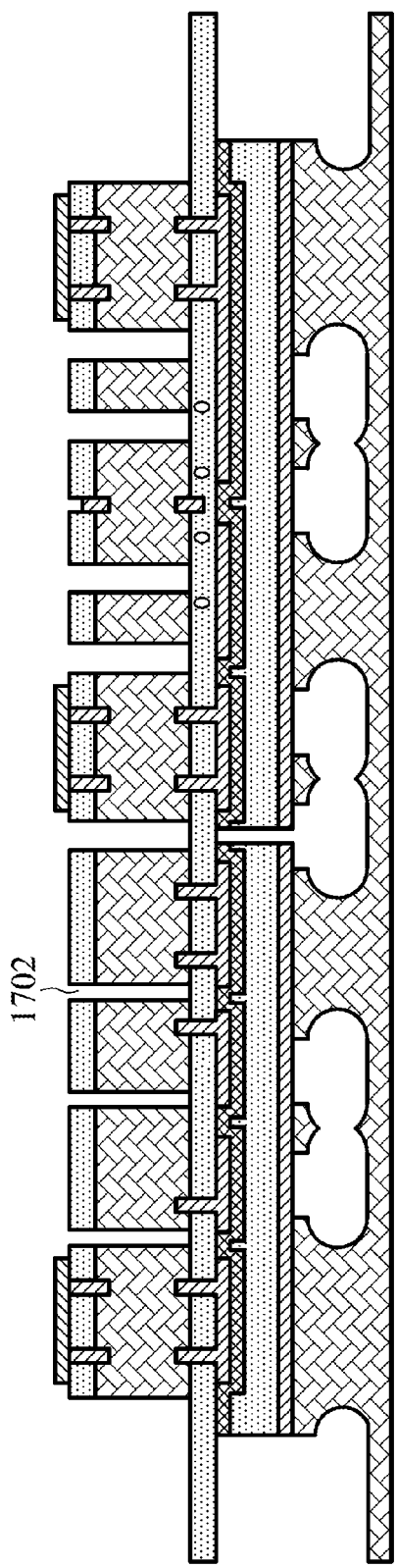
FIG. 17 illustrates a cross sectional view of the semiconductor device shown in FIG. 16 after the MEMS device's structure is defined in accordance with an embodiment.

FIG. 17 illustrates a cross sectional view of the semiconductor device shown in FIG. 16 after the MEMS device's structure is defined in accordance with an embodiment. Portions of the oxide layer and the substrate of the MEMS device are removed to define the MEMS structure. As shown in FIG. 17, the substrate of the MEMS device has been divided into several isolated regions by a plurality of deep openings 1702.

Figure 18:
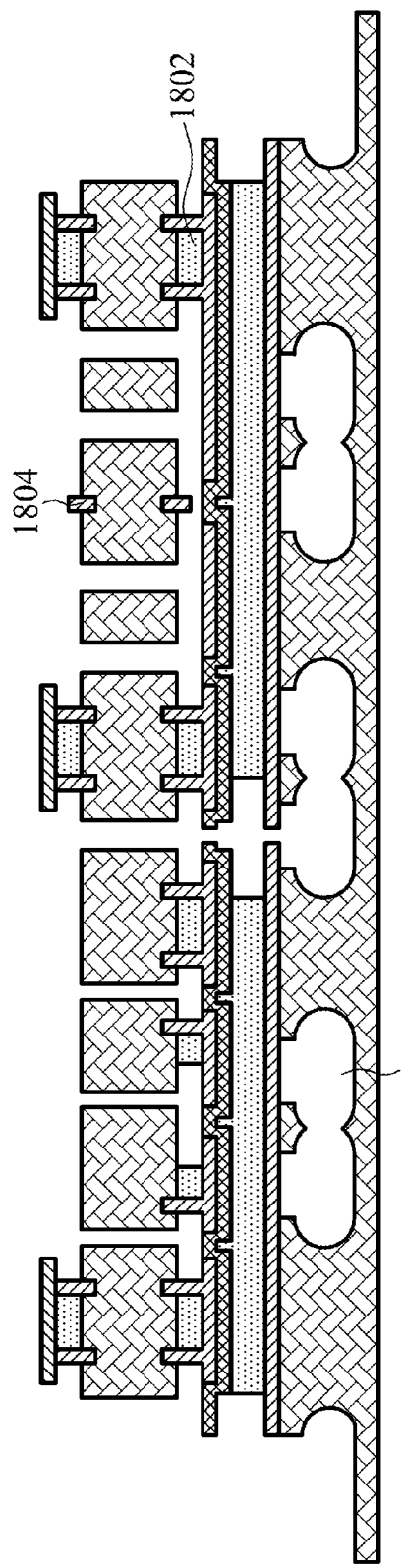
FIG. 18 illustrates a cross sectional view of the semiconductor device shown in FIG. 17 after a vapor HF process is applied to the MEMS device in accordance with an embodiment.

FIG. 18 illustrates a cross sectional view of the semiconductor device shown in FIG. 17 after a vapor HF process is applied to the MEMS device in accordance with an embodiment. The oxide layers of the MEMS device function as sacrificial oxide layers. The sacrificial oxide layers may be subject to a HF vapor etching process. As a result, portions of the sacrificial oxide layers are removed. It should be noted that the sacrificial oxide layers to be removed depend on the layout design.

As shown in FIG. 18, anchor regions such as anchor region 1802 may be protected by the polysilicon plugs. After the HF vapor etching process, sealed cavities of the carrier such as cavity 1806 are connected to the openings of the MEMS device. One advantageous feature of having a vapor HF etching process is that the dry releasing process from the HF vapor helps to reduce the occurrence of a well-known MEMS fabrication issue, namely the stiction problem.

Figure 19:
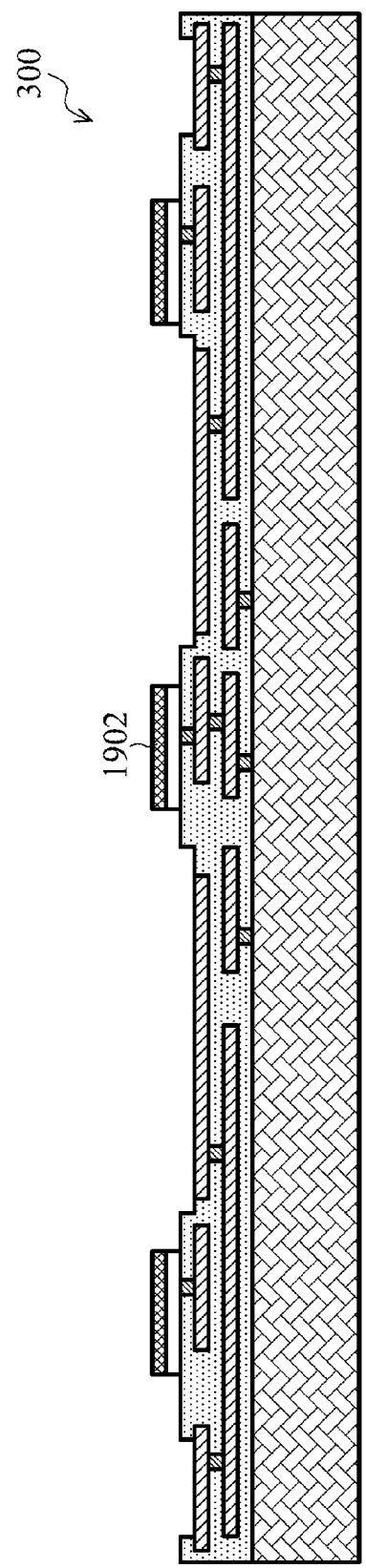
FIG. 19 illustrates the formation and patterning of a bonding material layer on the CMOS device in accordance with an embodiment.
Figure 20:
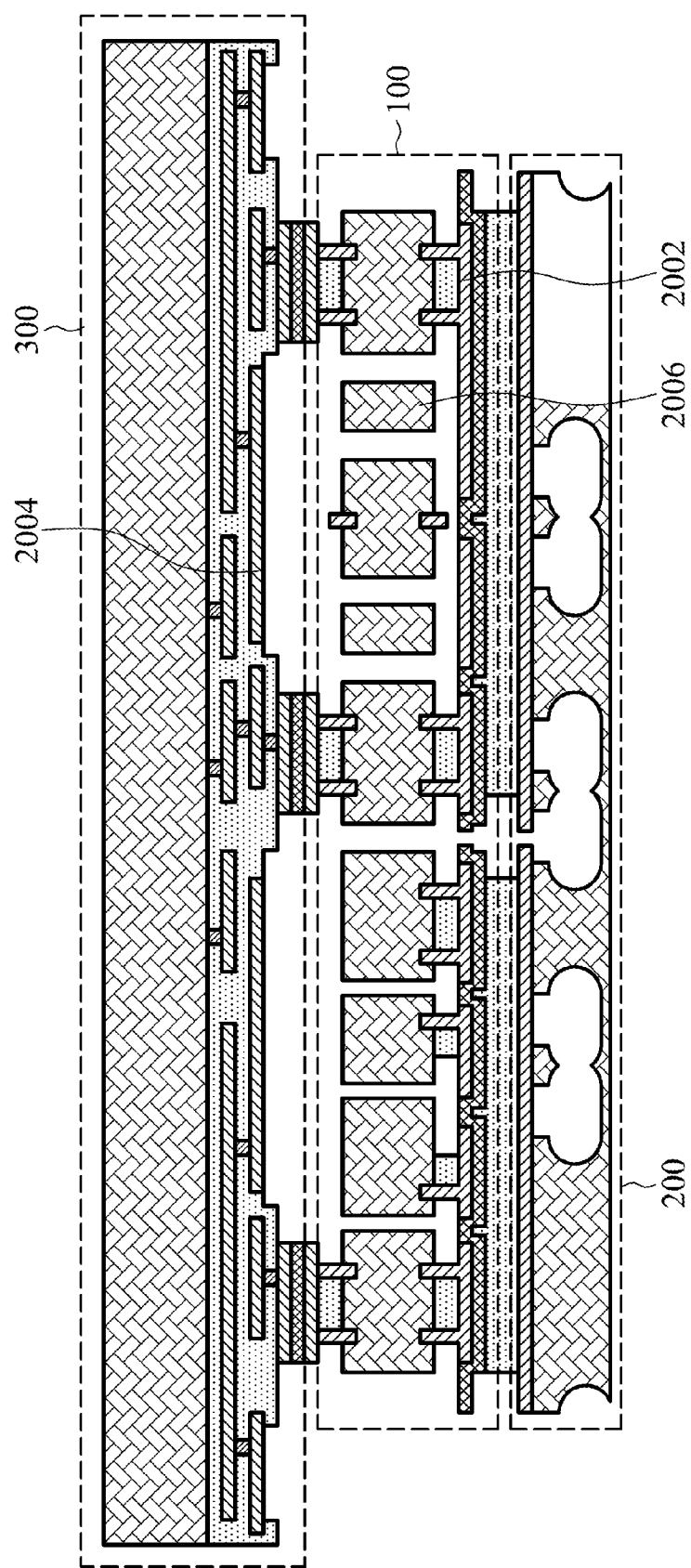
FIG. 20 illustrates a cross sectional view of a semiconductor device having a CMOS device stacked on top of a MEMS device in accordance with an embodiment.
Figure 21:
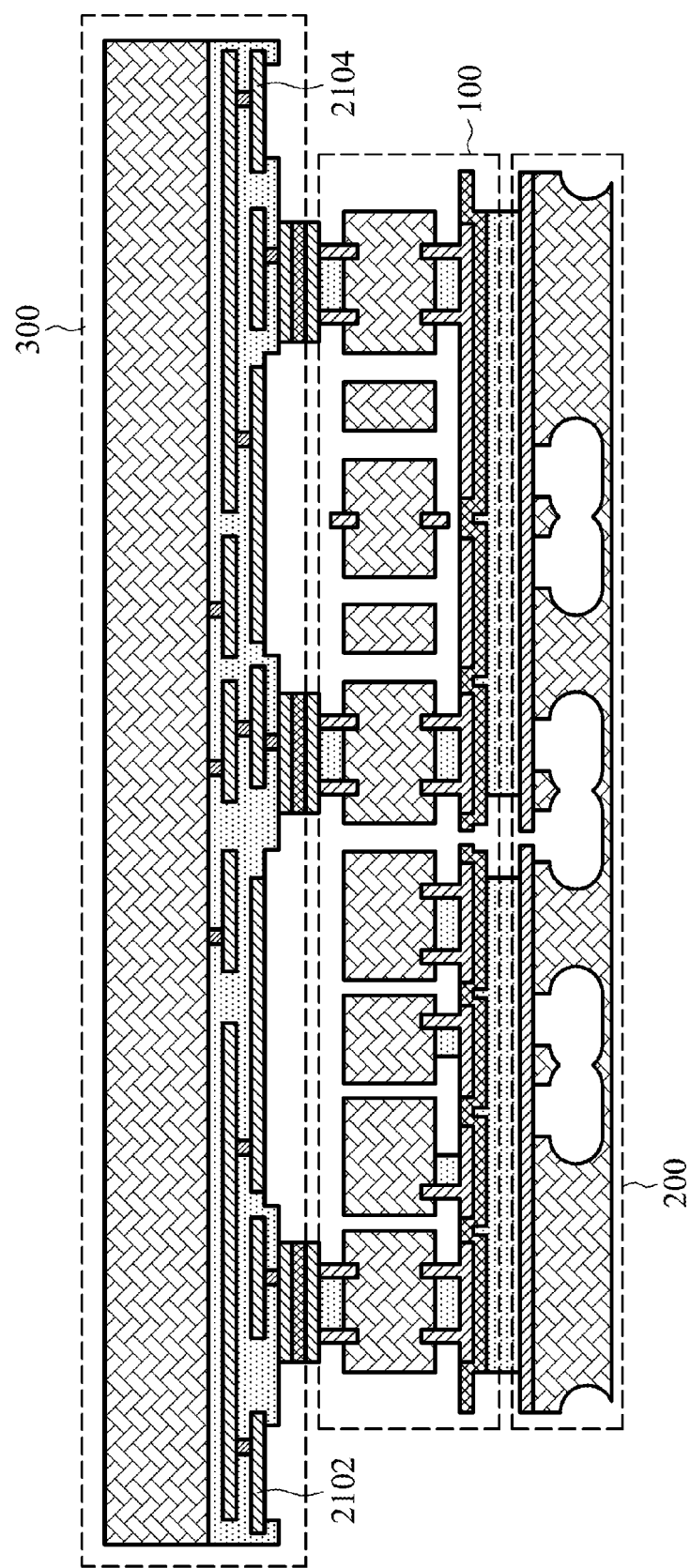
FIG. 21 illustrates a cross sectional view of the semiconductor device shown in FIG. 20 after a grinding process is applied to the semiconductor device in accordance with an embodiment.
Figure 22:
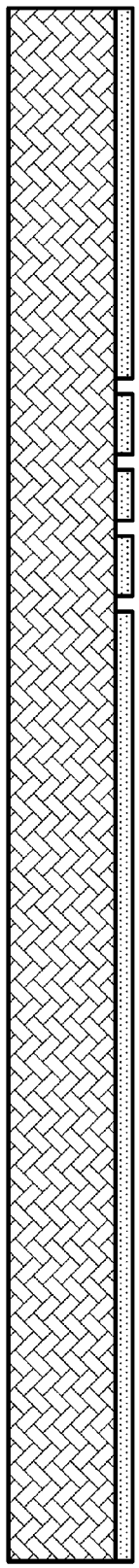
FIGS. 22-44 illustrate intermediate steps of fabricating a MEMS device in accordance with another embodiment.
Figure 23:
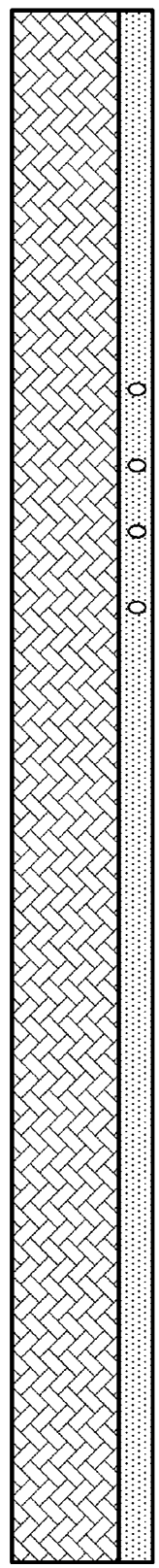
Figure 24:
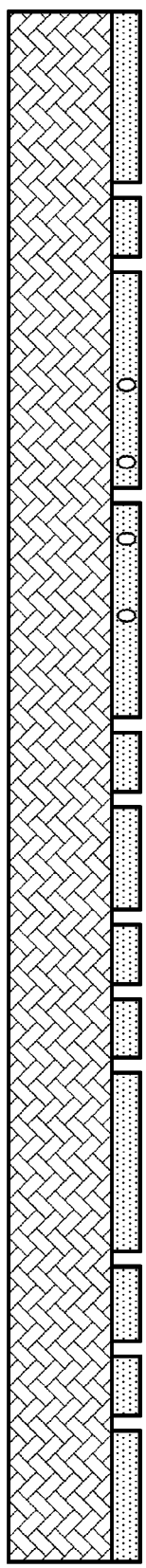
Figure 25:
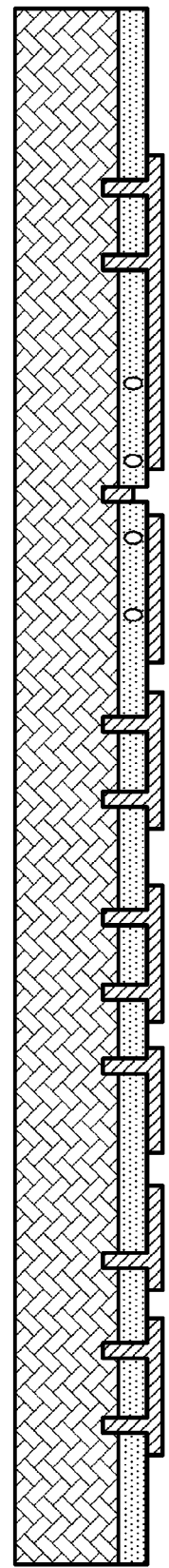
Figure 26:
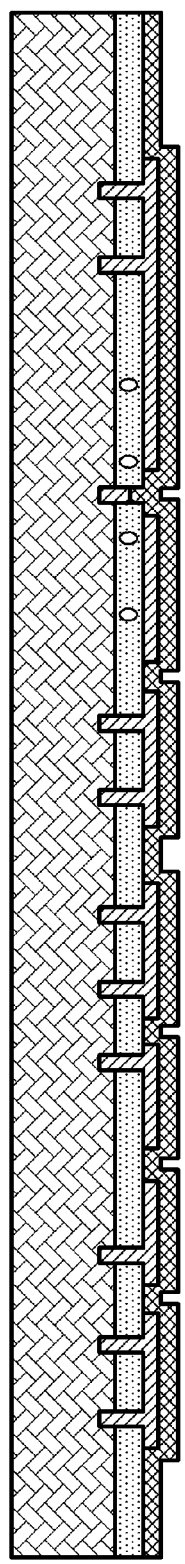
Figure 27:
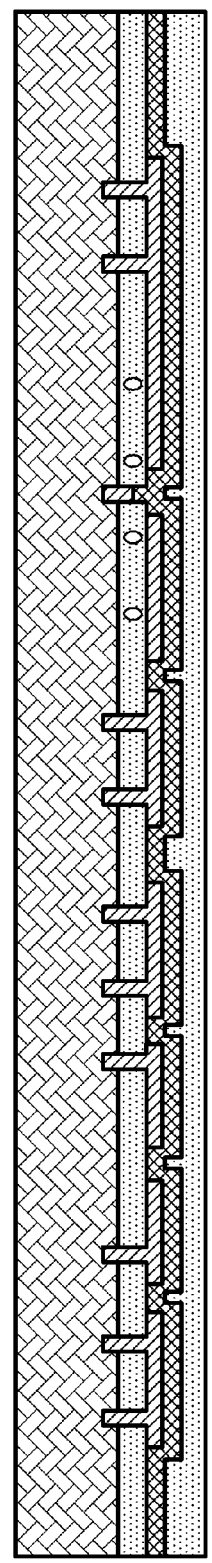
Figure 28:
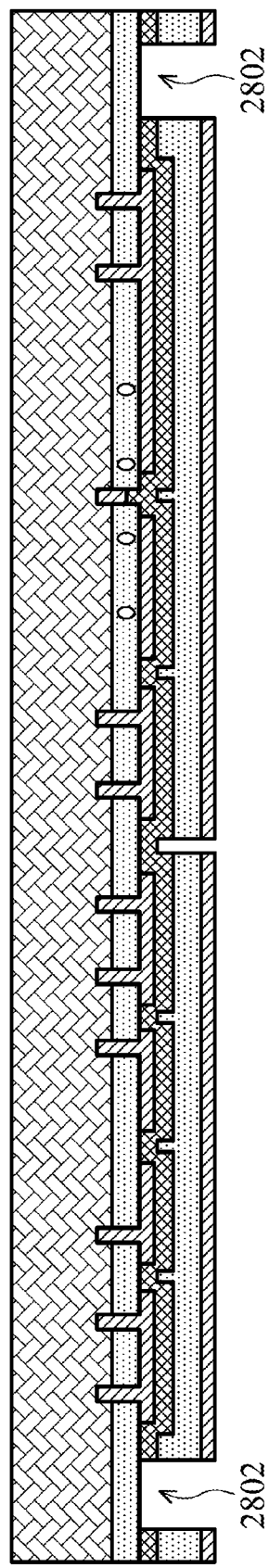
Figure 29:
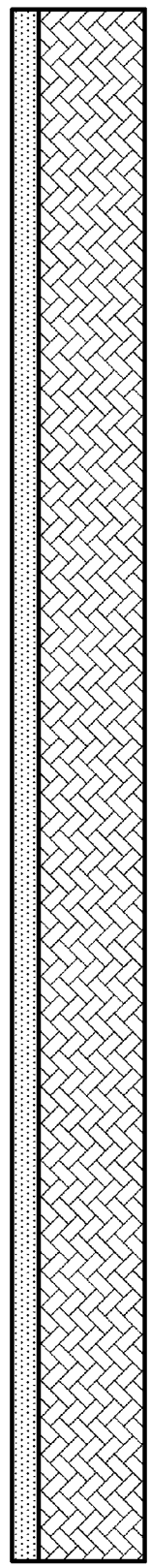
Figure 30:
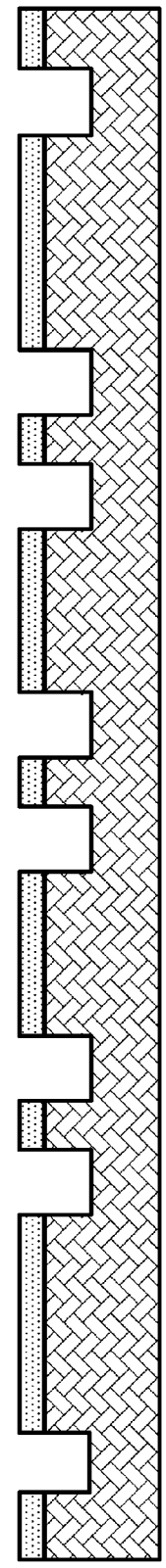
Figure 31:
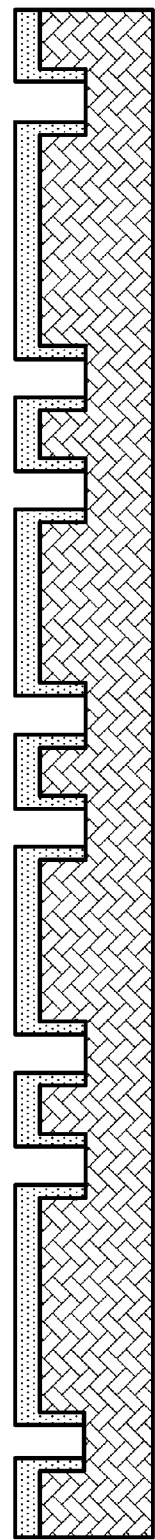

FIGS. 19-21 illustrate intermediate steps of bonding a CMOS device on top of the MEMS device in accordance with an embodiment. FIG. 19 illustrates the formation and patterning of a bonding material layer on the CMOS device in accordance with an embodiment. The CMOS device may comprise a substrate. The substrate may further comprise a variety of electrical circuits (not shown). The electrical circuits formed on the substrate may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner The bonding material layer 1902 is formed over the substrate of the CMOS device. In accordance with an embodiment, the bonding material layer 1902 may be made of aluminum copper, germanium, gold, the like, or a combination thereof. The bonding material layer 1902 may act as a eutectic bonding material for subsequent bonding processes. The bonding material 1902 may be formed using PVD or other acceptable methods, and may be patterned using acceptable lithography techniques.

FIG. 20 illustrates a cross sectional view of a semiconductor device having a CMOS device stacked on top of a MEMS device in accordance with an embodiment. The CMOS device 300 is bonded on top of the MEMS device 100. The two structures may be bonded together by eutectic bonding between the bonding material 1602 (on MEMS device 100) and bonding material 1902 (on CMOS device 300). As shown in FIG. 20, through the eutectic bonding process, movable elements (e.g., movable element 2006) may be located between a top electrode 2004 and a bottom electrode 2002.

In accordance with an embodiment, a bond force of larger than 30 kN and a temperature of larger than 400° C. can be applied to get a good bond strength. According to an embodiment, a vacuum chamber may be used as a bonding chamber. However, according to another embodiment, the bonding chamber has atmospheric pressure.

FIG. 21 illustrates a cross sectional view of the semiconductor device shown in FIG. 20 after a grinding process is applied to the semiconductor device in accordance with an embodiment. A grinding process is applied to the bottom side of the carrier 200 until the input and output pads 2102 and 2104 are exposed. The input and output pads 2102 and 2104 are electrically coupled to the integrated circuits of the CMOS device 300. In addition, the input and output pads 2102 and 2104 may further be coupled to external circuits (not shown).

FIGS. 22-44 illustrate intermediate steps of fabricating a MEMS device in accordance with another embodiment. The fabrication steps of the MEMS device and the carrier shown in FIGS. 22-34 are similar to the fabrication steps shown in FIGS. 2-14, and hence are not discussed again to avoid unnecessary repetition.

Figure 34:
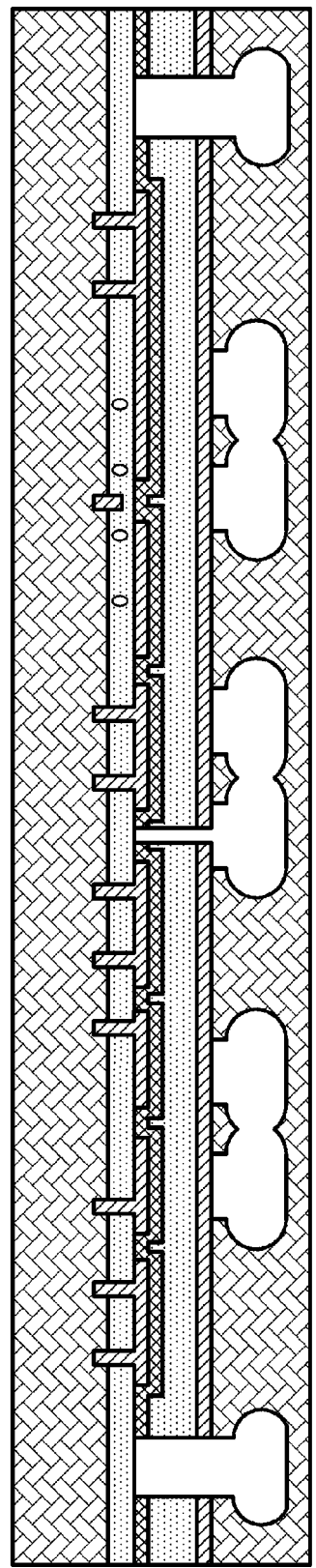
Figure 35:
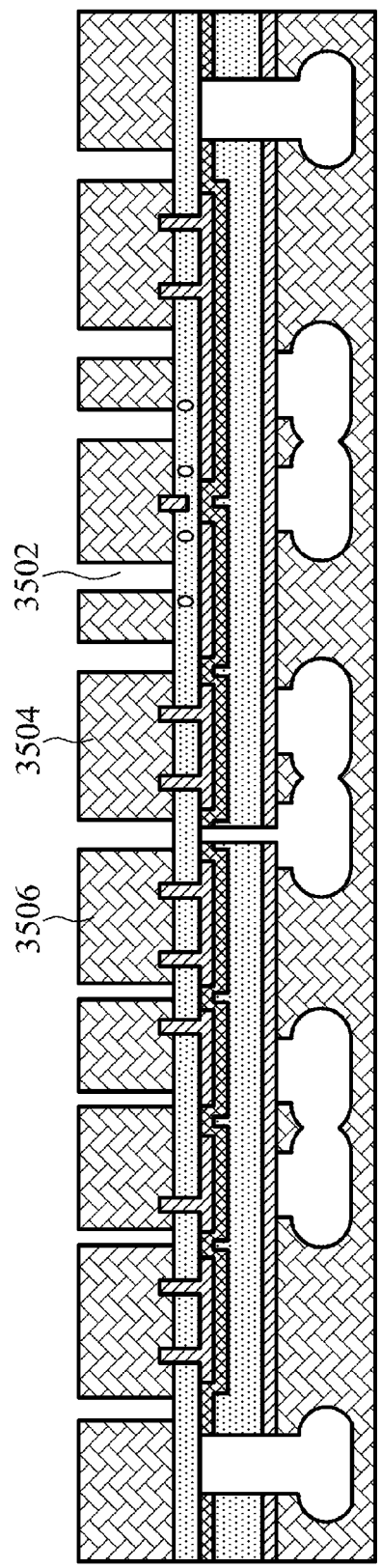

FIG. 35 illustrates a cross sectional view of the semiconductor device shown in FIG. 34 after a plurality of through openings are formed in the substrate of the MEMS device in accordance with an embodiment. A thinning process is performed on the top surface of the MEMS device. The grinding is performed until a desired thickness is achieved. In accordance with an embodiment, the MEMS device is of a thickness in a range from about 5 um to about 60 um.

An etch step is then performed to etch through substrate of the MEMS device to form through-openings 3502. The etch step may be performed using DRIE. Through-openings 3502 may physically and electrically isolate some portions (e.g., portion 3504) of substrate from other portions (e.g., portion 3506) of the substrate.

Figure 36:
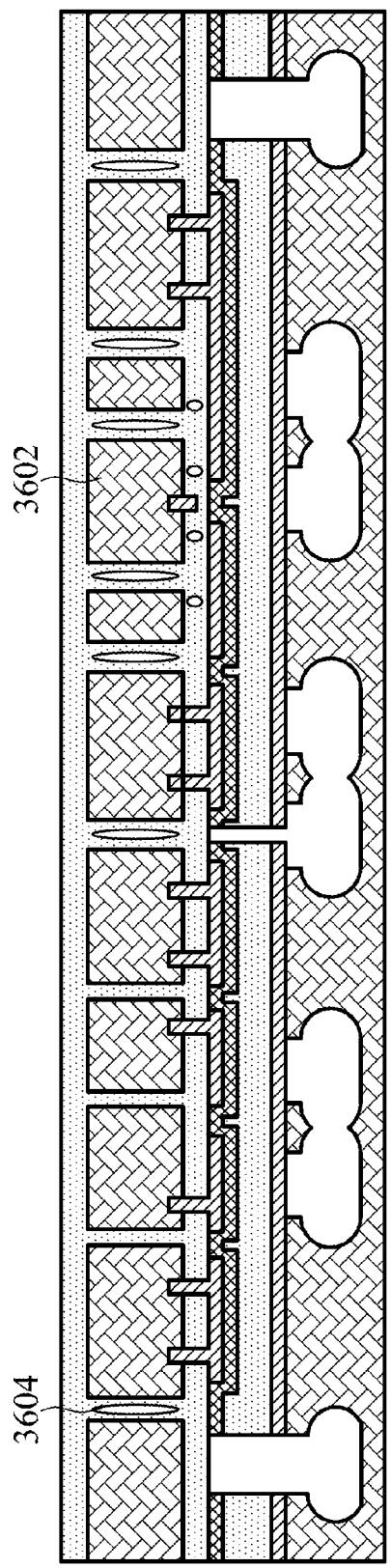

FIG. 36 illustrates a cross sectional view of the semiconductor device shown in FIG. 35 after an oxide deposition is applied to the semiconductor device in accordance with an embodiment. The oxide deposition may form a sacrificial oxide layer 3602. The sacrificial oxide layer 3602 can be formed by any suitable fabrication techniques such as CVD, LPTEOS, PECVD, HDPCVD and the like. It should be noted that the sacrificial oxide layer 3602 may be formed through multiple oxide deposition processes and their corresponding etch-back processes. In addition, as shown in FIG. 36, there may be an air opening 3604 formed in the sacrificial oxide layer 3602.

Figure 37:
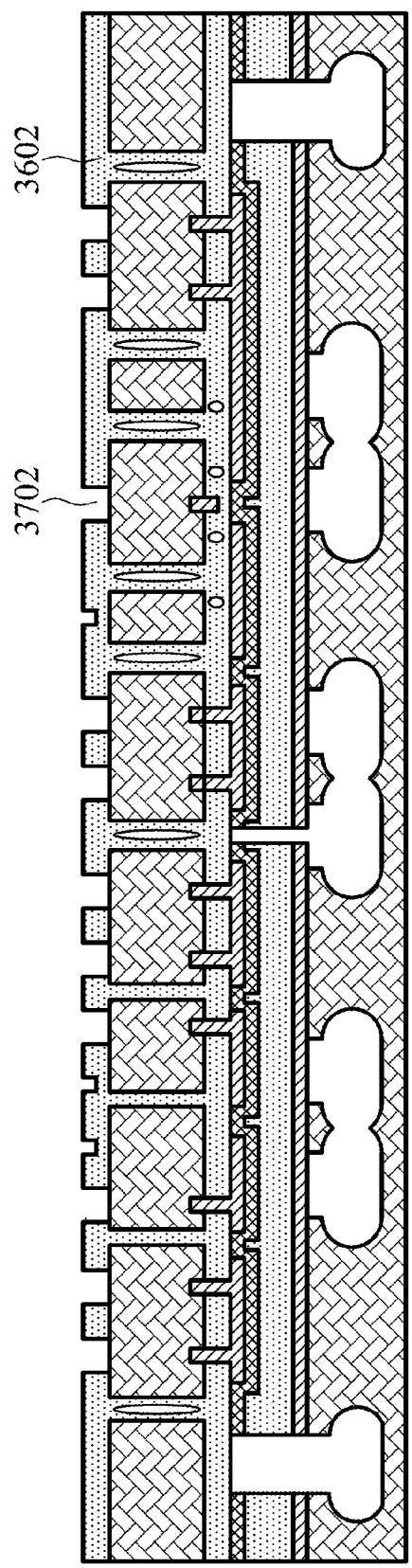

FIG. 37 illustrates a cross sectional view of the semiconductor device shown in FIG. 36 after a patterning process is applied to the sacrificial oxide layer in accordance with an embodiment. The patterning process is employed to form openings 3702 in the sacrificial oxide layer 3602. The patterning process may be accomplished by depositing a commonly used mask material (not shown) such as photoresist over the sacrificial oxide layer 3602. The mask material is then patterned and the sacrificial oxide layer 3602 is etched in accordance with the pattern to form the openings 3702.

Figure 38:
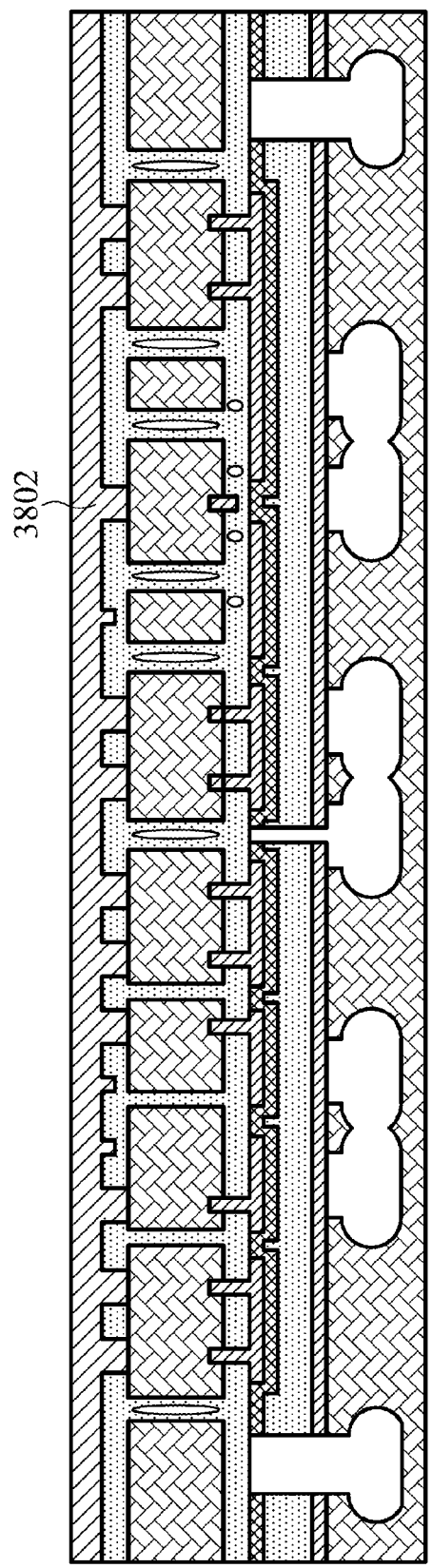

FIG. 38 illustrates a cross sectional view of the semiconductor device shown in FIG. 37 after a polysilicon layer is formed on the sacrificial oxide layer in accordance with an embodiment. A layer of polysilicon 3802 is formed over the structure, including within openings 3702 (not shown but illustrated in FIG. 37). As shown in FIG. 38, the polysilicon layer 3802 not only fills the openings 3702, it also covers the top surface of the MEMS device.

Figure 39:
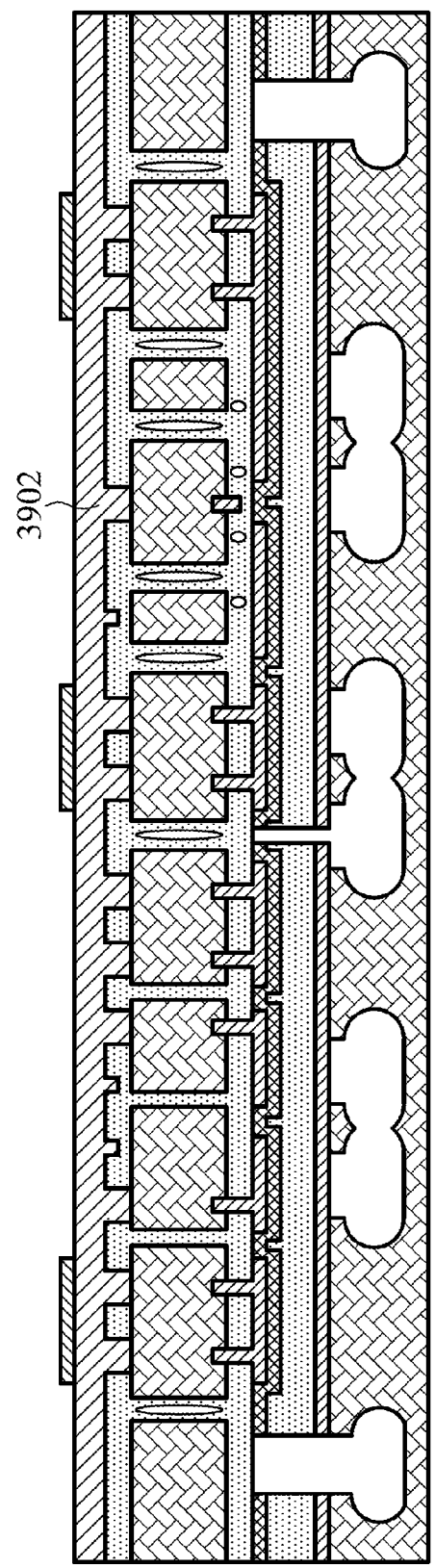

FIG. 39 illustrates the formation and patterning of a bonding material layer on top of the MEMS device in accordance with an embodiment. The bonding material layer 3902 may be made of aluminum copper, germanium, gold, the like, or a combination thereof. The bonding material 3902 may be formed using PVD and the like. The bonding material 3902 may be patterned using acceptable lithography techniques.

Figure 40:
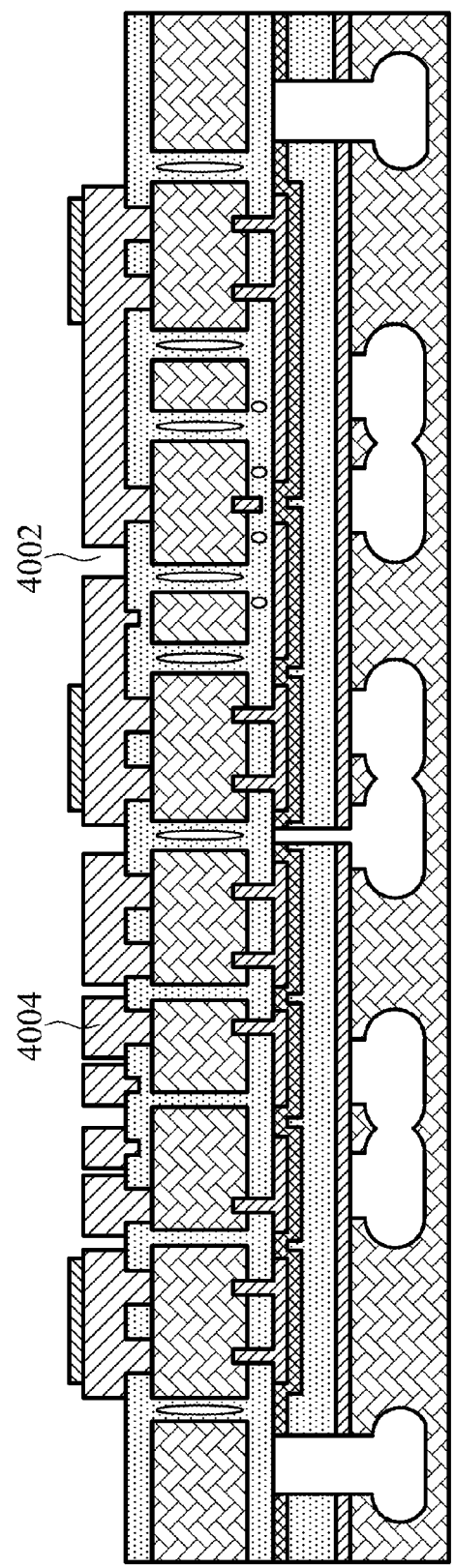

FIG. 40 illustrates a cross sectional view of the semiconductor device shown in FIG. 39 after an etching process is applied to the polysilicon layer in accordance with an embodiment. A patterning process is applied to the polysilicon layer 3802 (shown in FIG. 38) by depositing a commonly used mask material (not shown) such as photoresist. The mask material is then patterned and the polysilicon layer 3802 is etched back to remove portions of polysilicon layer 3802 overlying the MEMS device, while leaving polysilicon plugs, such as plug 4004 and openings 4002.

Figure 41:
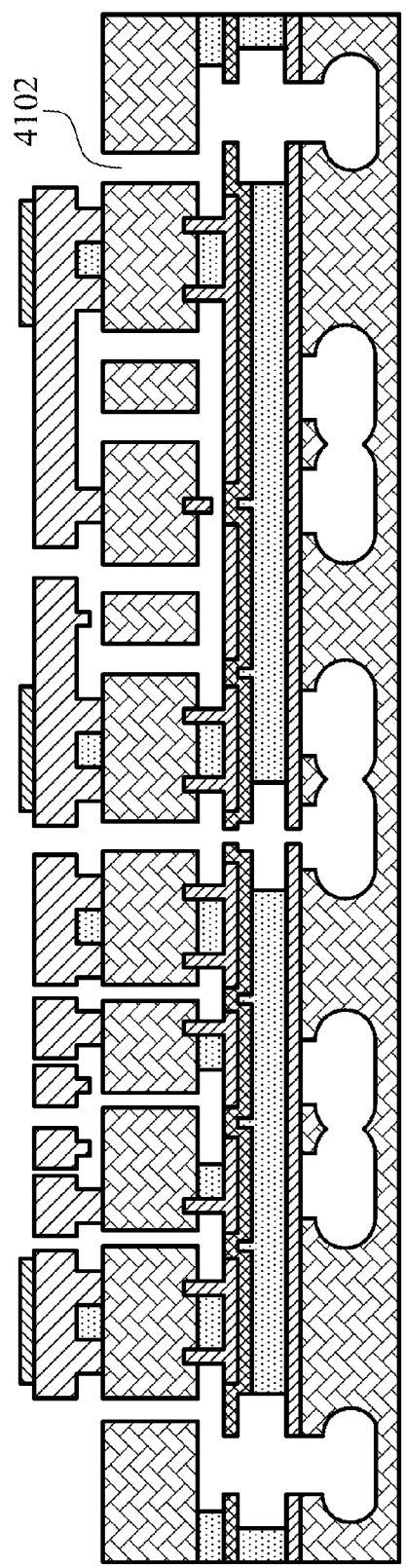

FIG. 41 illustrates a cross sectional view of the semiconductor device shown in FIG. 40 after a vapor HF process is applied to the sacrificial oxide layer in accordance with an embodiment. The fabrication step of FIG. 41 is similar to the fabrication step described above with respect to FIG. 17, and hence is not discussed in further detail to avoid unnecessary repetition.

Figure 42:
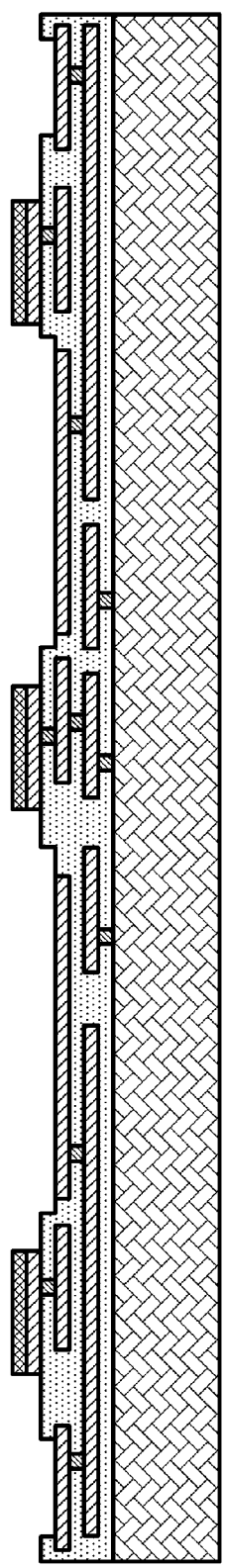
Figure 43:
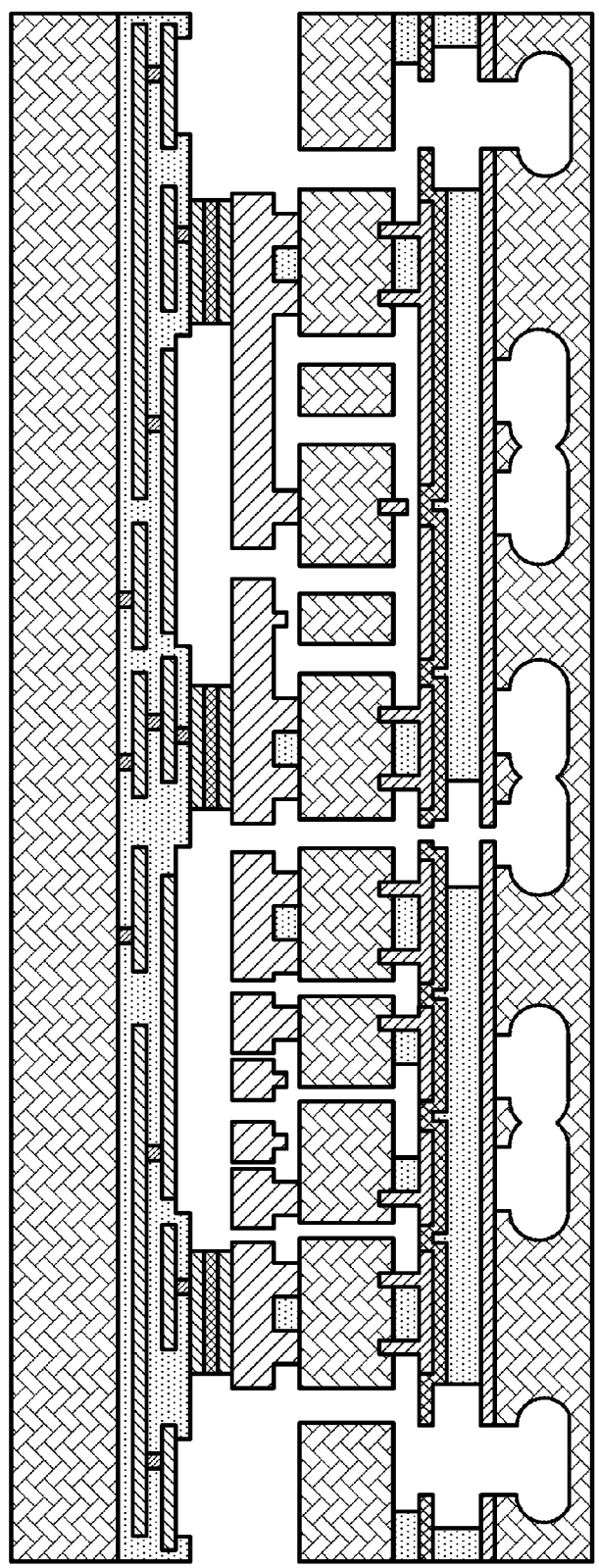
Figure 44:
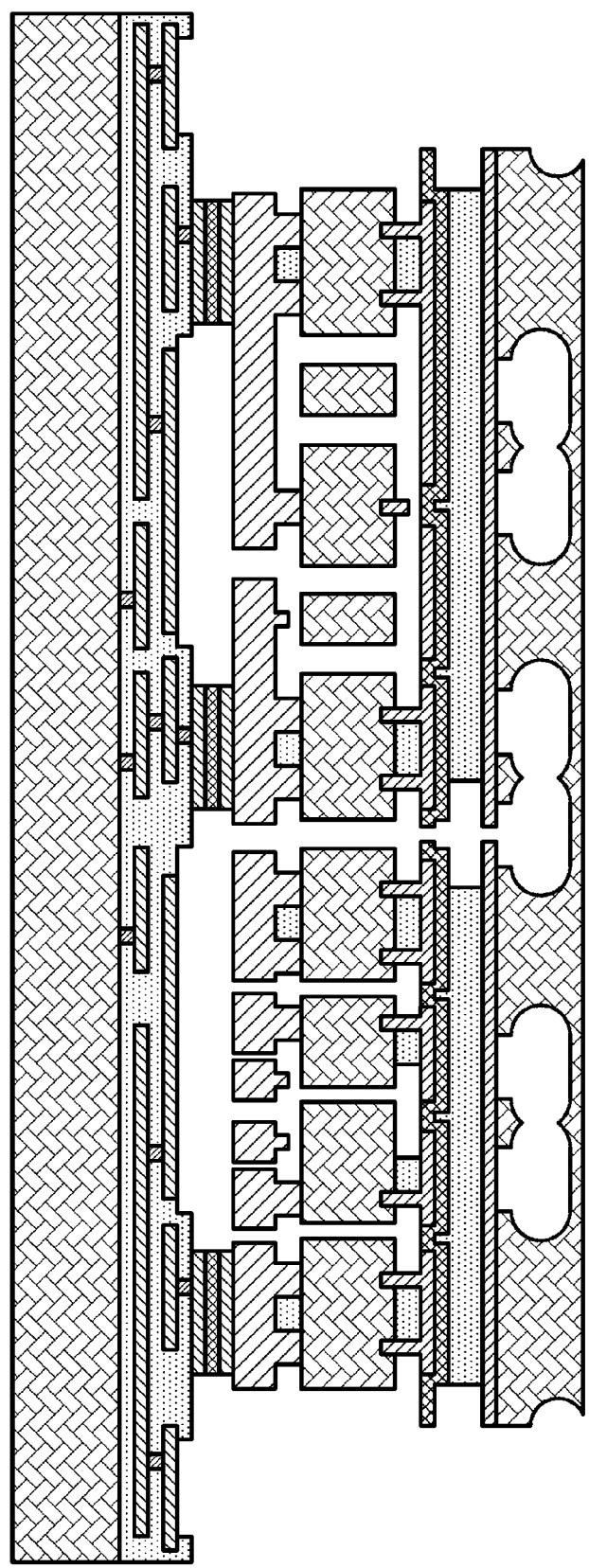

FIGS. 42-44 illustrate intermediate steps of bonding a CMOS device on top of the MEMS device in accordance with an embodiment. The steps of bonding the CMOS device on top of the MEMS device are similar to those described above with respect FIGS. 18-20, and hence are not discussed again herein.

FIGS. 45-52 illustrate intermediate steps of fabricating a MEMS device in accordance with another embodiment. The fabrication steps illustrated in FIGS. 45-52 are applicable to other semiconductor structures such as forming interconnects of the MEMS device including electrical readouts and the like.

Figure 32:
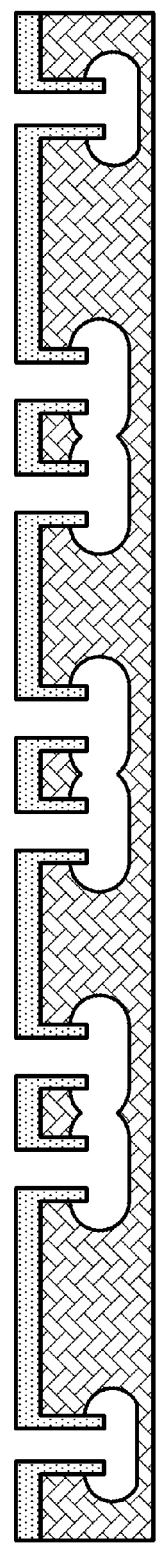
Figure 33:
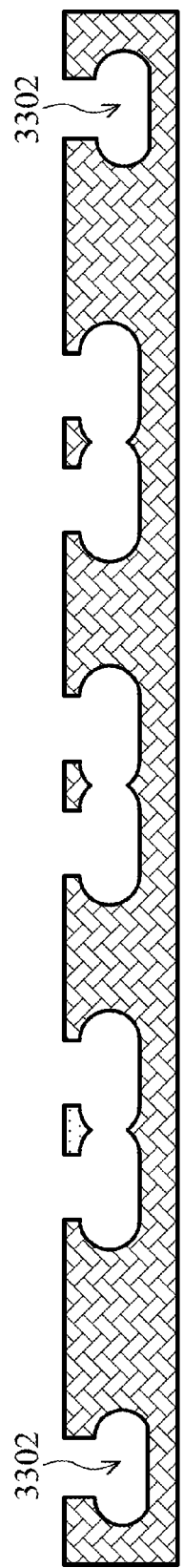
Figure 45:
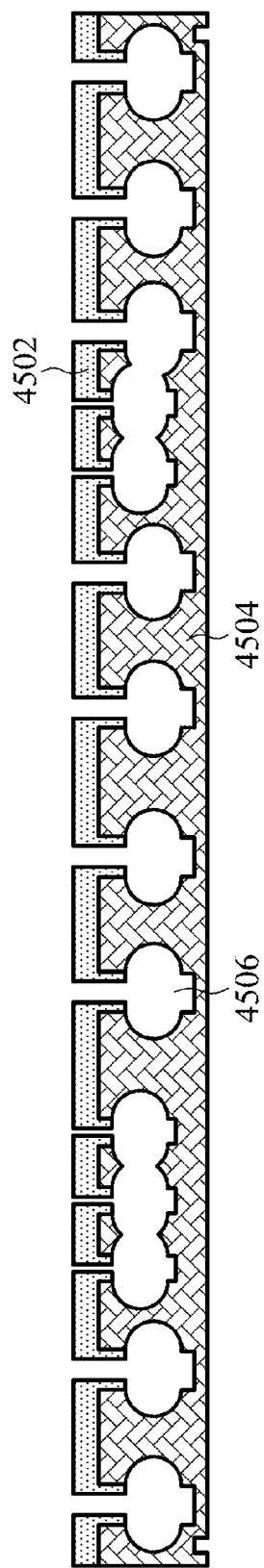
FIGS. 45-52 illustrate intermediate steps of fabricating a MEMS device in accordance with another embodiment.

FIG. 45 illustrates a cross sectional view of a semiconductor device similar to the semiconductor devices shown in FIG. 12 and FIG. 32 after a further anisotropic etching process is applied to a carrier in accordance with some embodiments. The carrier 4502 shown in FIG. 45 is similar to the carrier 200 shown in FIG. 1A. The substrate 4504 of the carrier 4502 may be formed of the same material as the substrate 902 shown in FIG. 9. In accordance with an embodiment, the substrate 4504 is a low resistive silicon substrate.

As shown in FIG. 45, portions of the substrate 4504 are removed to form trench and via extrusions over cavities 4506. An etching process, such as a reactive ion etch (RIE) or other dry etch, an anisotropic wet etch, or any other suitable anisotropic etch or patterning process, may be performed to form the trench and via extrusions over the cavities 4506. The trench and via extrusions are used to form electrical readout interconnects for the MEMS device, which will be described below with respect to FIG. 52.

Figure 46:
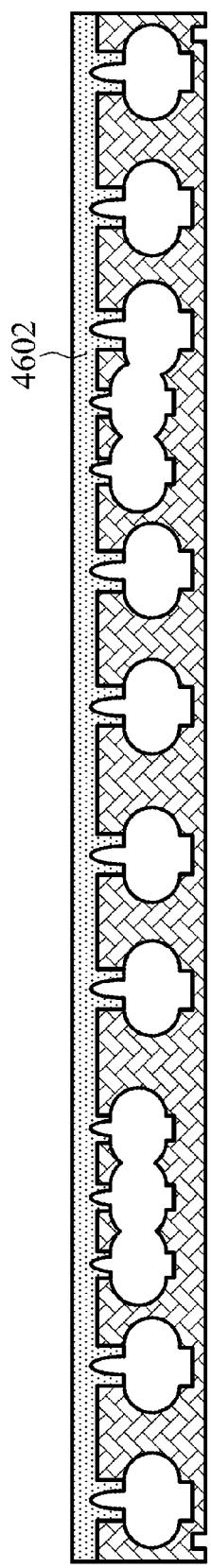

FIG. 46 illustrates a cross sectional view of the semiconductor device after the trench and via openings shown in FIG. 45 are sealed by a dielectric layer in accordance with an embodiment. The dielectric layer 4602 may be formed, for example, of a low-K dielectric material, such as silicon oxide. In accordance with an embodiment, the dielectric layer may be an oxide layer formed by suitable semiconductor fabrication techniques such as a CVD process and the like.

Figure 47:
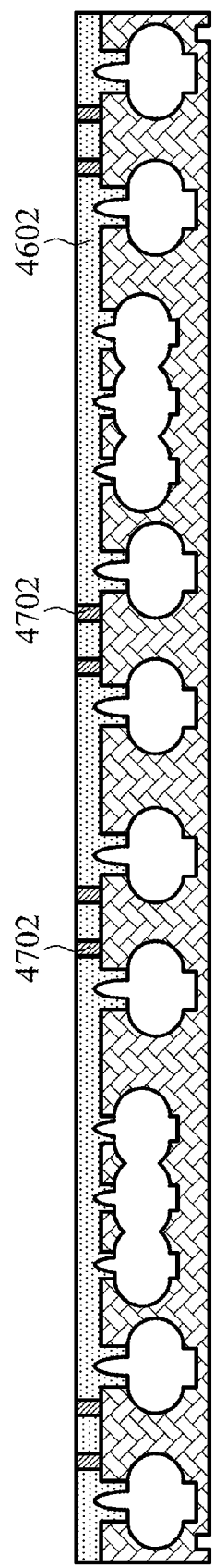

FIG. 47 illustrates a cross sectional view of the semiconductor device shown in FIG. 46 after forming contact vias in the dielectric layer in accordance with an embodiment. A plurality of contact vias 4702 may be formed in the dielectric layer 4602 through a patterning process. The contact vias may be formed of suitable metal materials such as tungsten and the like.

Figure 48:
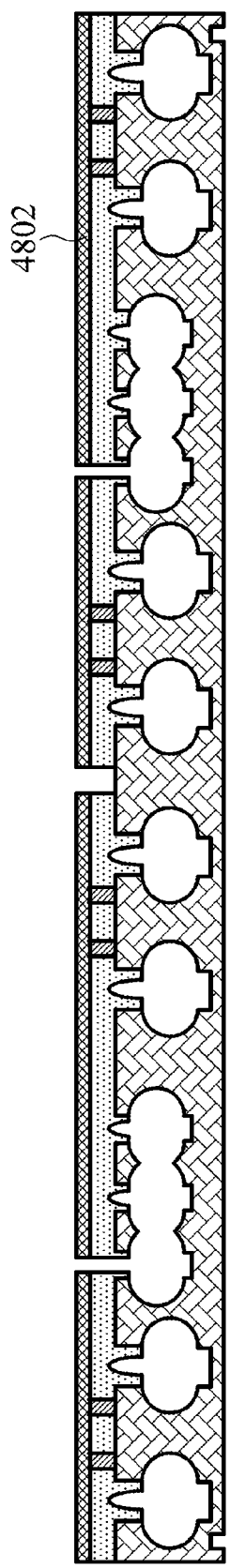

FIG. 48 illustrates a cross sectional view of the semiconductor device shown in FIG. 47 after depositing and patterning a bonding layer on the oxide and the contact vias in accordance with an embodiment. The bonding layer 4802 may be formed of germanium and the like. The bonding layer 4802 is patterned to expose cavities for pressure reduction.

Figure 49:
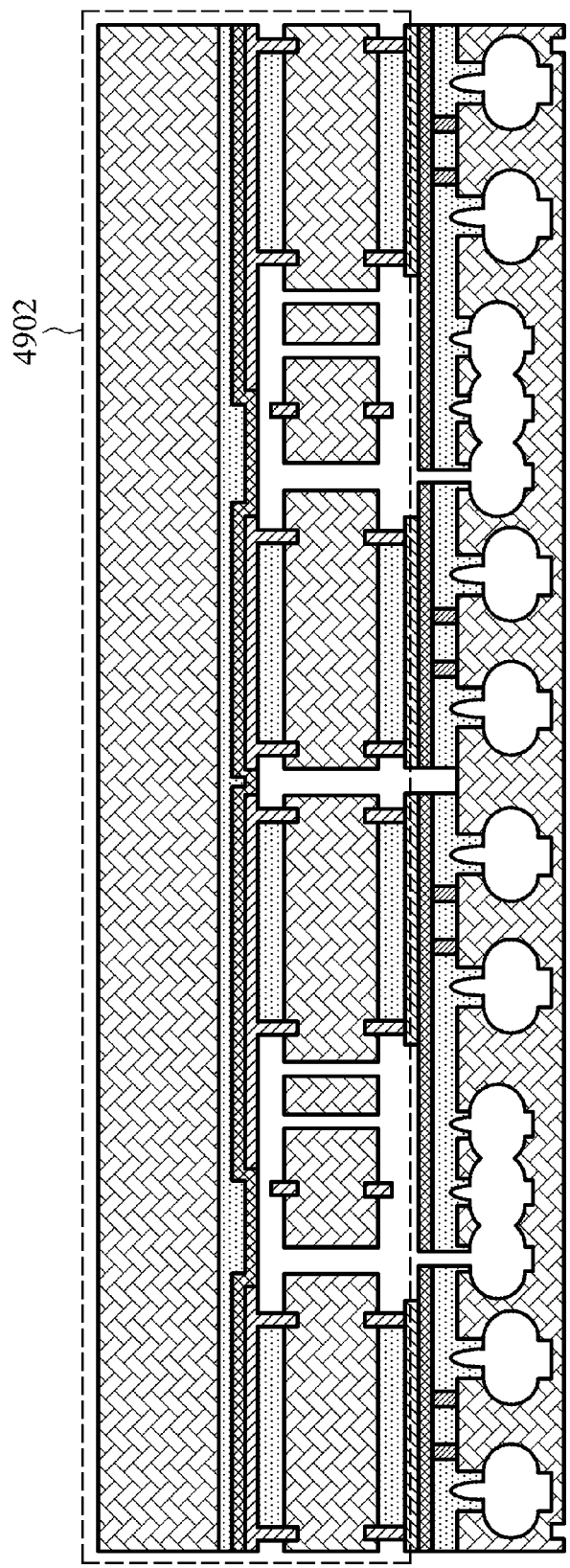

FIG. 49 illustrates a cross sectional view of the semiconductor device after a MEMS device is bonded on top of the semiconductor device shown in FIG. 48 in accordance with an embodiment. Before a bonding process is applied to the MEMS device and the semiconductor device, a bonding layer comprising suitable bonding materials such as aluminum copper may be deposited and patterned on the MEMS device 4902. Through a suitable bonding process such as a eutectic bonding process, a conductive bonding interface is established between the semiconductor device and the MEMS device 4902. For example, the bonding interface may comprise a eutectic alloy formed by a eutectic bonding reaction between a first bonding layer comprising germanium and a second bonding layer comprising an aluminum copper alloy.

Figure 50:
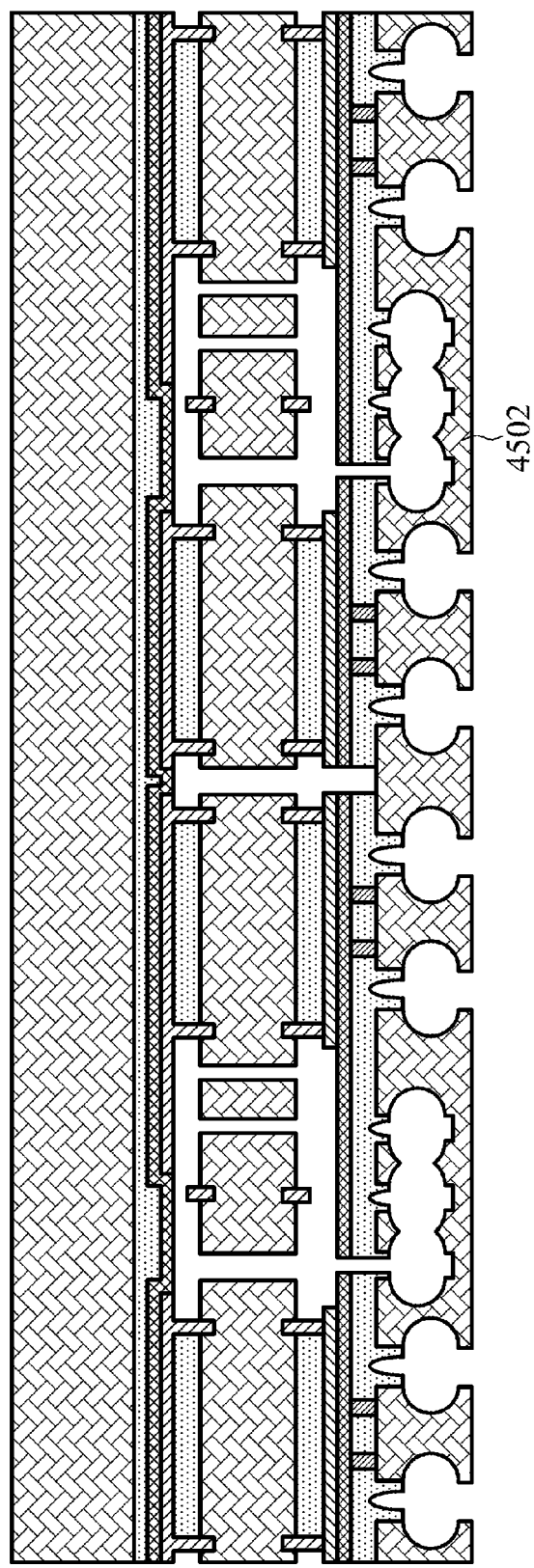

FIG. 50 illustrates a cross sectional view of the semiconductor device shown in FIG. 49 after a grinding process is applied to the semiconductor device in accordance with an embodiment. A grinding process is applied to the non-bonding side of the carrier 4502 until the trench and via extrusions are exposed. The grinding process may be implemented by suitable grinding techniques including silicon grinding, chemical mechanical polishing, etching and the like.

Figure 51:
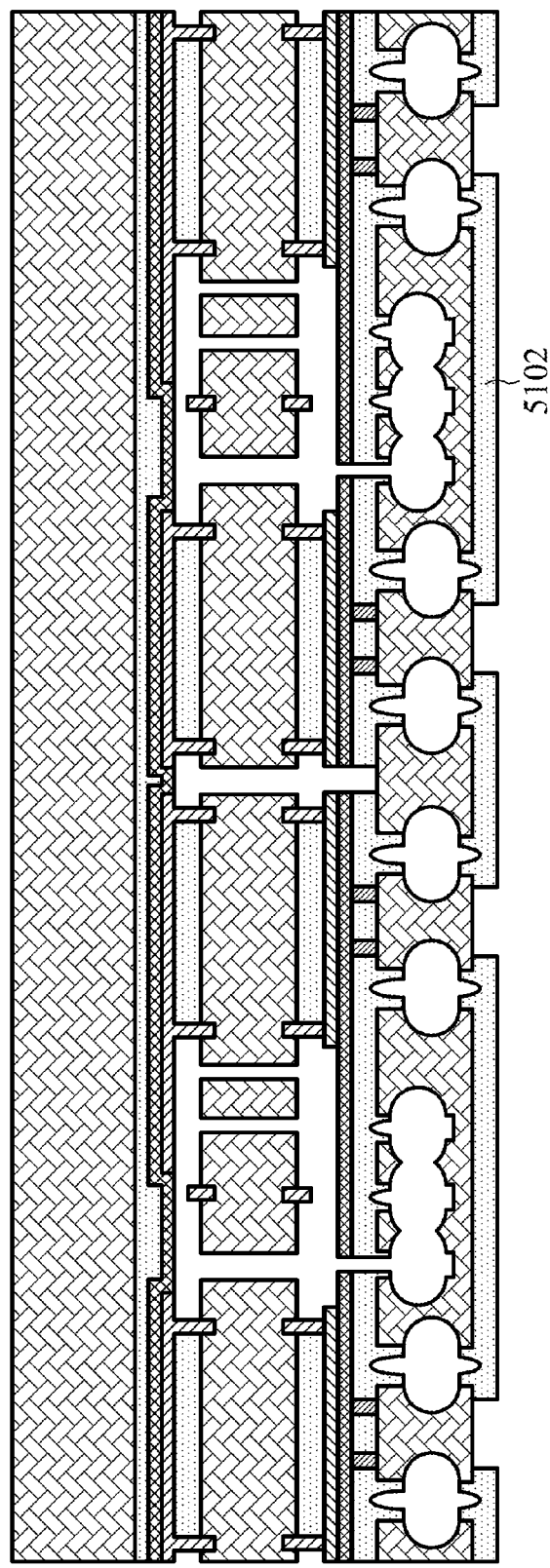

FIG. 51 illustrates a cross sectional view of the semiconductor device shown in FIG. 50 after sealing the trench and via openings with a dielectric layer and patterning the dielectric layer to form contact-to-silicon vias in accordance with an embodiment. The dielectric layer 5102 may be an oxide layer. The oxide layer may be suitable semiconductor fabrication techniques such as CVD and the like.

Figure 52:
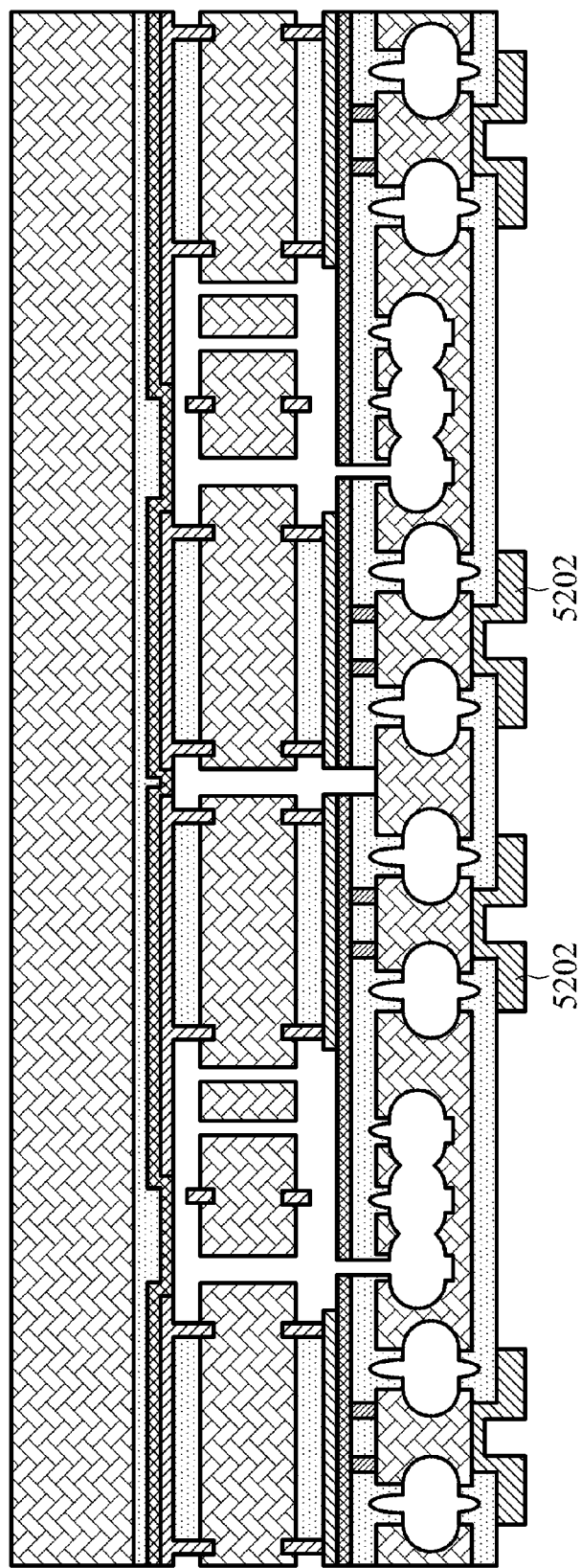

FIG. 52 illustrates a cross sectional view of the semiconductor device shown in FIG. 51 after electrical readout structures are formed over the non-bonding side of the carrier in accordance with an embodiment. Conductive materials such as an aluminum copper alloy are deposited on the non-bonding side of the carrier through suitable deposition processes such as CVD, PVD and the like. The conductive material layer is further patterned to form electrical readout structures 5202 as shown in FIG. 52.

Figure 53:
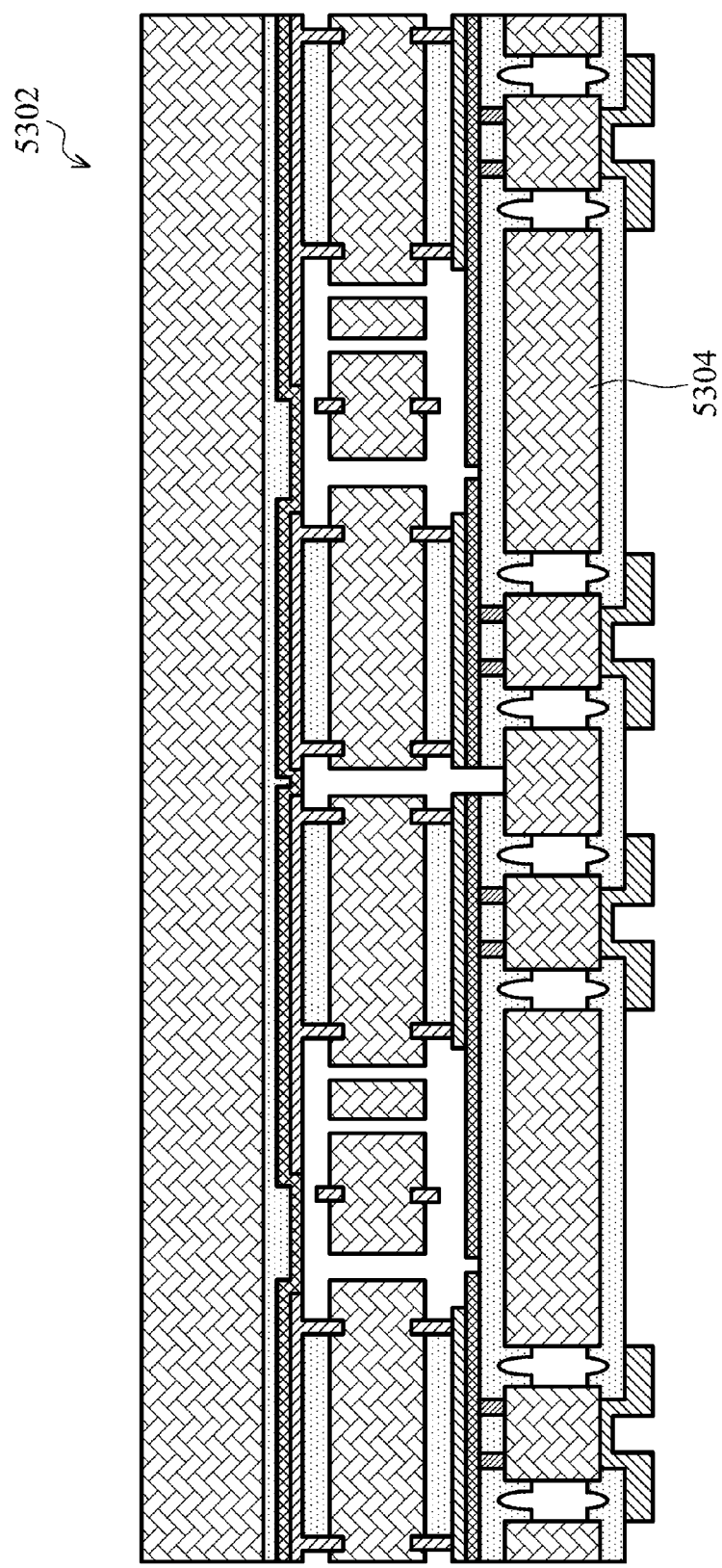
FIG. 53 illustrates a cross sectional view of a semiconductor device in accordance with another embodiment.

FIG. 53 illustrates a cross sectional view of a semiconductor device in accordance with another embodiment. The structure of the semiconductor device 5302 is similar to the semiconductor device shown in FIG. 52 except that the substrate 5304 of the semiconductor device 5302 does not include cavities. In other words, the isotropic etching process illustrated in FIG. 12 is not applied to the substrate 5304. Other fabrication steps for forming the semiconductor device 5302 shown in FIG. 53 are similar to those described above with respect to FIGS. 46-52, and hence are not discussed again herein.

Figure 54:
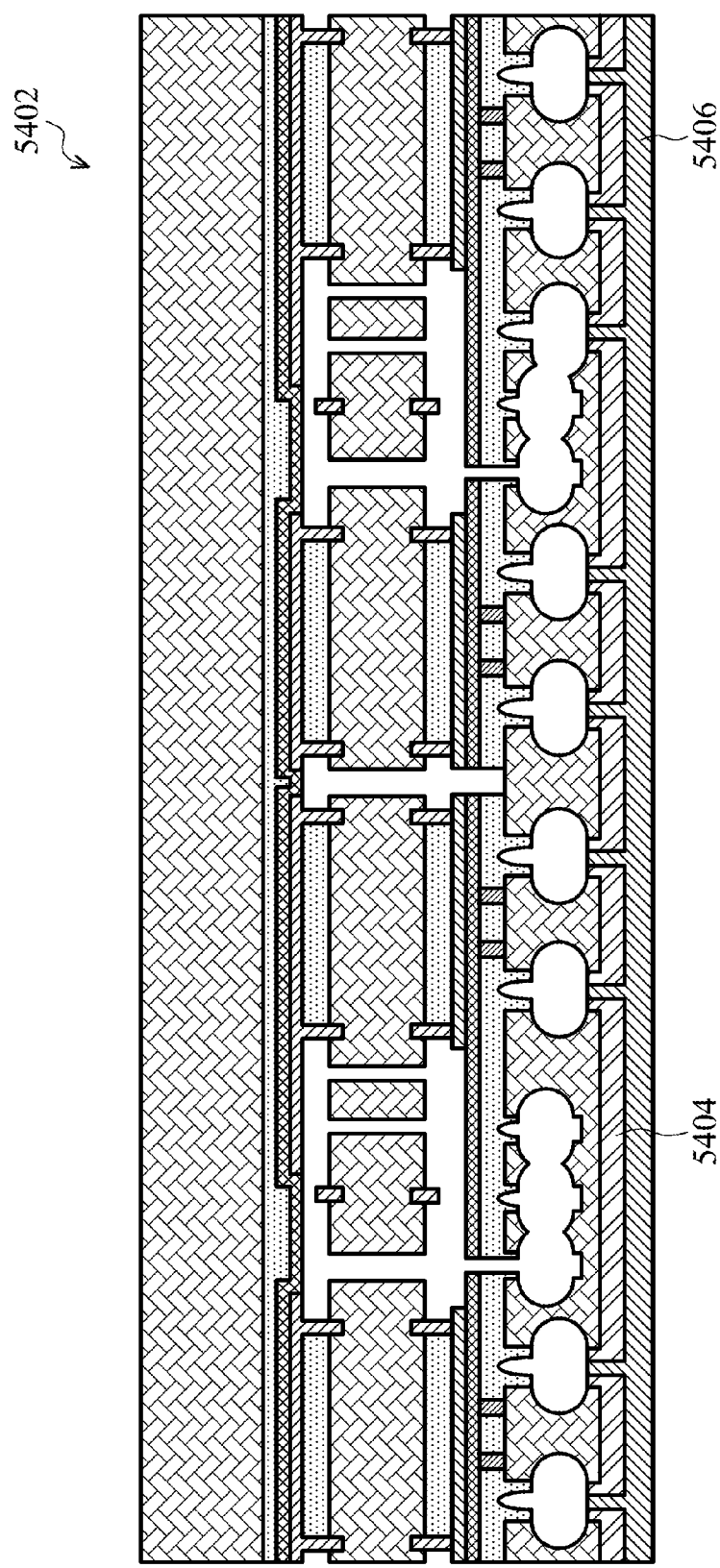
FIG. 54 illustrates a cross sectional view of a semiconductor device in accordance with yet another embodiment.

FIG. 54 illustrates a cross sectional view of a semiconductor device in accordance with yet another embodiment. The structure of the semiconductor device 5402 is similar to the semiconductor device shown in FIG. 51 except that the trench and via openings are sealed by an oxide layer 5404 and an aluminum copper layer 5406.

Figure 55:
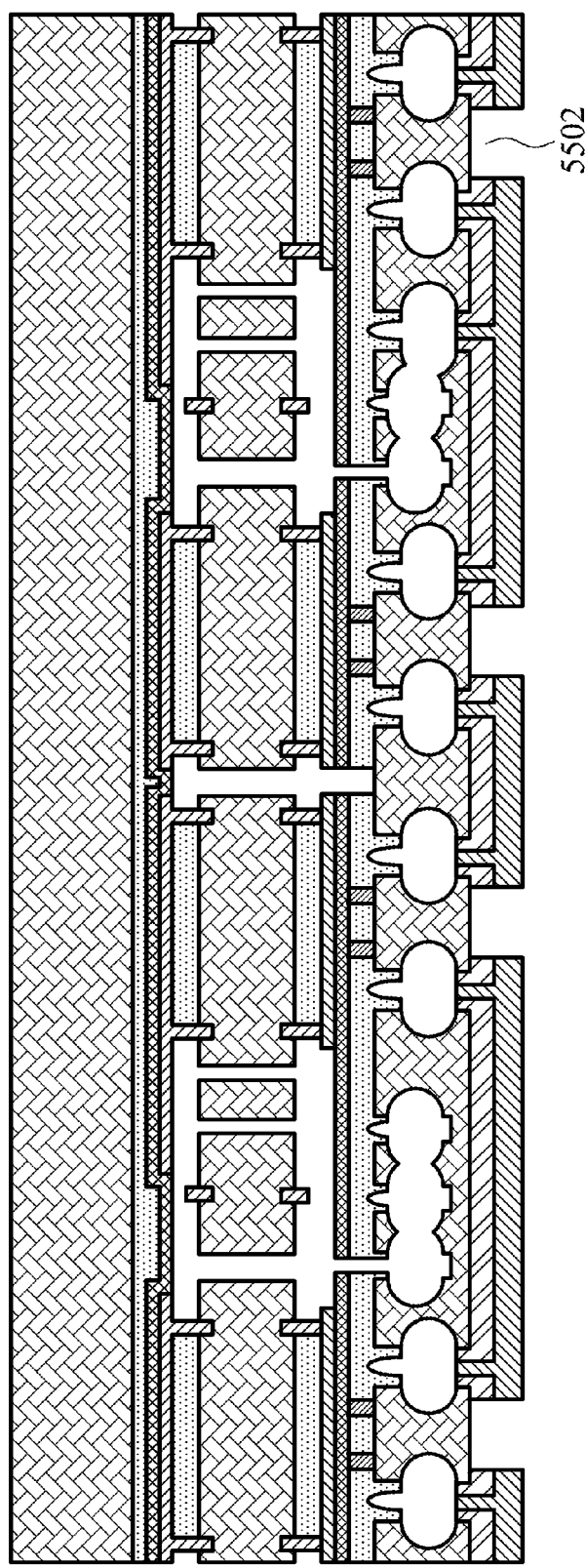
FIG. 55 illustrates a cross sectional view of the semiconductor device shown in FIG. 54 after a patterning process is applied to the non-bonding side of the carrier in accordance with an embodiment.

FIG. 55 illustrates a cross sectional view of the semiconductor device shown in FIG. 54 after a patterning process is applied to the non-bonding side of the carrier in accordance with an embodiment. A patterning process is applied to the oxide layer 5404 as well as the aluminum copper layer 5406 to form contact-to-silicon vias 5502.

Figure 56:
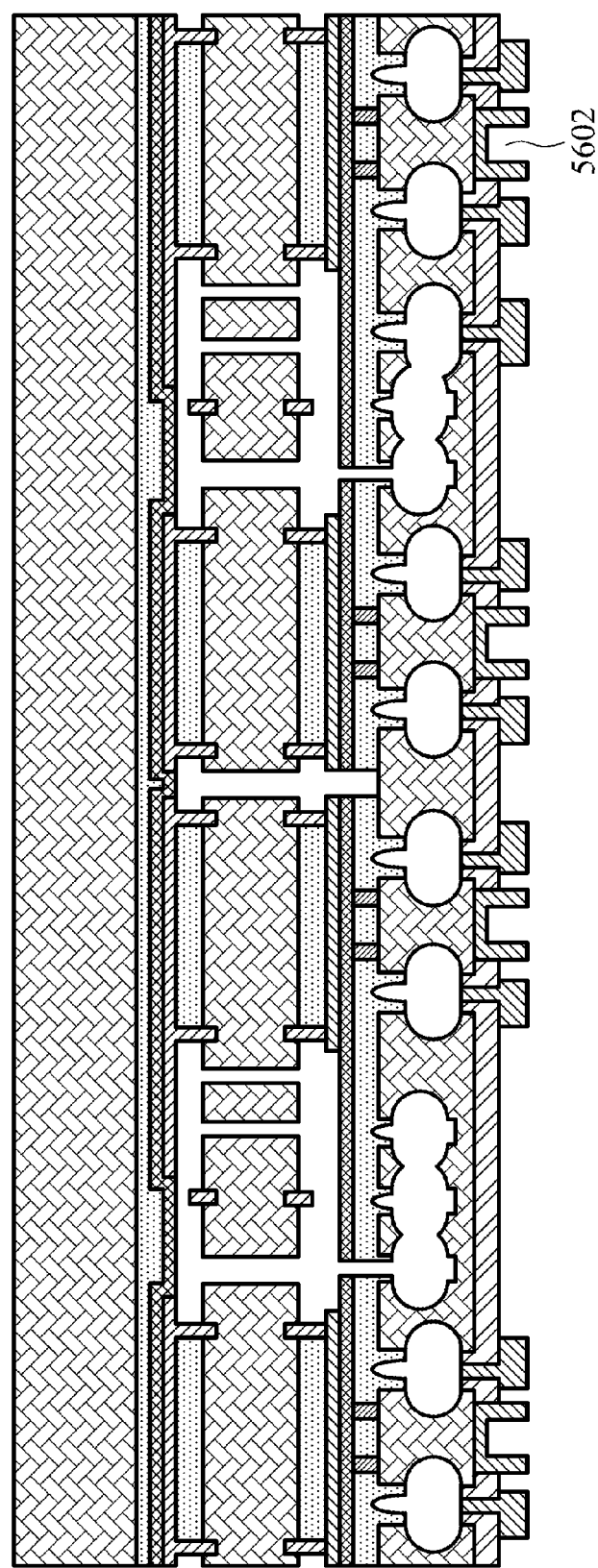
FIG. 56 illustrates a cross sectional view of the semiconductor device shown in FIG. 55 after a conductive material is deposited to form electrical readout structures in accordance with an embodiment.

FIG. 56 illustrates a cross sectional view of the semiconductor device shown in FIG. 55 after a conductive material is deposited to form electrical readout structures in accordance with an embodiment. Conductive materials such as aluminum copper may be deposited on the contact-to-silicon vias 5502 to form electrical readout structures 5602 of the MEMS device.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    providing a micro-electro-mechanical system (MEMS) substrate having:
        a shielding layer coupled to ground;
        a plurality of vias coupled to the shielding layer; and
        a first dielectric layer on a first side of the MEMS substrate;
    providing a carrier including a plurality of cavities;
    bonding the first side of the MEMS substrate on the carrier, wherein a first portion of the MEMS substrate is in direct contact with a first portion of the carrier; a second portion of the MEMS substrate is in direct contact with a second portion of the carrier; the first portion of the carrier and the second portion of the carrier are separated by a cavity; and the shielding layer fully covers a contacting surface of the first portion of the carrier and a contacting surface of the second portion of the carrier;
    forming a first bonding material layer on a second side of the MEMS substrate;
    applying a sacrificial layer removal process to the MEMS substrate;
    providing a semiconductor substrate including a second bonding material layer; and
    bonding the semiconductor substrate on the second side of the MEMS substrate.

2. The method of claim 1, further comprising:
    depositing a vapor HF stop layer on the first dielectric layer;
    depositing a second dielectric layer on the vapor HF stop layer, wherein the plurality of vias are formed in the second dielectric layer; and
    forming a bonding layer on the second dielectric layer.

3. The method of claim 1, further comprising:
    depositing a third dielectric layer on the carrier;
    forming a plurality of openings in the carrier through an etching process;
    forming a dielectric protection layer on sidewalls of the openings; and
    enlarging the openings through an isotropic etching process.

4. The method of claim 1, further comprising:
    forming a plurality of MEMS openings in the MEMS substrate from the second side of the MEMS substrate;
    depositing a fourth dielectric layer to fill the MEMS openings;
    forming a thin conductive layer on the fourth dielectric layer;
    forming the first bonding material layer on the thin conductive layer; and
    patterning the thin conductive layer to form a plurality of conductive elements and movable elements.

5. The method of claim 1, further comprising:
    sealing a first side of a cavity of the carrier with a first sealing layer;
    applying a thinning process to a second side of carrier until a second side of the cavity is exposed, wherein the second side of the carrier is a nonbonding side of the carrier; and
    sealing the second side of the cavity with a second sealing layer.

6. The method of claim 5, further comprising:
    forming an electrical readout structure over the second side of the carrier.

7. A method comprising:
    patterning a first dielectric layer on a first side of a first substrate to form a plurality of first openings in the first dielectric layer;
    sealing the plurality of first openings to form a plurality of seams in the first dielectric layer;
    patterning the first dielectric layer to form a plurality of second openings;
    depositing a first polysilicon layer over the first dielectric layer;
    patterning the first polysilicon layer to form a plurality of functional elements;
    depositing a second dielectric layer over the first polysilicon layer;
    forming a plurality of vias in the second dielectric layer;
    depositing a bonding interface layer over the second dielectric layer, wherein the bonding interface layer is connected to a ground plane and the plurality of vias;
    patterning the bonding interface layer and the second dielectric layer to form channels over the first substrate;
    bonding the first substrate on a second substrate comprising cavities, wherein the bonding interface layer is in direct contact with the second substrate;
    depositing a bonding material layer over a second side of the first substrate;
    removing portions of the first substrate to form a plurality of openings in the first substrate;
    applying an etching process to the first dielectric layer to connect the plurality of openings in the first substrate with the cavities of the second substrate; and
    bonding a third substrate on the second side of the first substrate.

8. The method of claim 7, further comprising:
    depositing an oxide material over the first dielectric layer in a non-conformable manner to form overhangs at edges of the plurality of first openings.

9. The method of claim 7, further comprising:
    after the step of patterning the first dielectric layer to form the plurality of second openings, thinning the first dielectric layer to a thickness in a range from about 0.5 um to about 5 μm.

10. The method of claim 7, wherein:
the bonding interface layer is formed of polysilicon.

11. The method of claim 7, further comprising:
the first substrate is a MEMS substrate;
the second substrate is a carrier substrate; and
the third substrate is a CMOS substrate.

12. The method of claim 7, further comprising:
depositing a third dielectric layer on the second substrate;
forming a plurality of openings in the second substrate through an etching process;
forming a dielectric protection layer on sidewalls of the plurality of openings; and
enlarging the plurality of openings through an isotropic etching process.

13. The method of claim 7, wherein:
the second substrate comprises at least two cavities.

14. A method comprising:
depositing a first dielectric layer over a first side of a MEMS substrate;
forming a plurality of vias in the first dielectric layer;
depositing a bonding interface layer over the first dielectric layer, wherein the bonding interface layer is connected to a ground plane and the plurality of vias;
patterning the bonding interface layer and the first dielectric layer to form channels over the MEMS substrate;
bonding the MEMS substrate on a carrier substrate comprising cavities, wherein the bonding interface layer is in direct contact with the carrier substrate;
depositing a bonding material layer over a second side of the MEMS substrate;
removing portions of the MEMS substrate to form a plurality of openings in the MEMS substrate; and
bonding a CMOS substrate on the second side of the MEMS substrate.

15. The method of claim 14, further comprising:
patterning a second dielectric layer on the first side of a first substrate to form a plurality of first openings in the second dielectric layer, wherein the second dielectric layer is in direct contact with the MEMS substrate;
sealing the plurality of first openings to form a plurality of seams in the second dielectric layer through an oxide deposition process;
patterning the second dielectric layer to form a plurality of second openings;
depositing a first polysilicon layer over the second dielectric layer; and
patterning the first polysilicon layer to form a plurality of functional elements.

16. The method of claim 14, further comprising:
depositing a third dielectric layer on the carrier substrate;
forming a plurality of openings in the carrier substrate through an etching process;
forming a dielectric protection layer on sidewalls of the plurality of openings; and
enlarging the plurality of openings through an isotropic etching process.

17. The method of claim 16, further comprising:
sealing the plurality of openings in the carrier substrate by a fourth dielectric layer;
forming a plurality of contact vias in the fourth dielectric layer; and
depositing a carrier bonding layer on the fourth dielectric layer.

18. The method of claim 14, further comprising:
prior to the step of depositing the bonding material layer over the second side of the MEMS substrate, depositing a second polysilicon layer over the second side of the MEMS substrate.

19. The method of claim 14, further comprising:
after step of bonding the MEMS substrate on the carrier substrate comprising cavities, thinning a non-bonding side of the carrier substrate until the cavities of the carrier substrate are exposed.

20. The method of claim 19, further comprising:
depositing an oxide layer on the non-bonding side of the carrier substrate to seal the cavities; and
forming electrical readout structures over the oxide layer.

\* \* \* \* \*